US012640411B2

(12) United States Patent
Falls et al.

(10) Patent No.: US 12,640,411 B2
(45) Date of Patent: *May 26, 2026

(54) POWER SUPPLY CONTROL SYSTEMS AND METHODS

(71) Applicant: AVL Mobility Technologies, Inc., Plymouth, MI (US)

(72) Inventors: Bruce Falls, Dove Canyon, CA (US); Scott Kochan, San Jose, CA (US); Alwin Lutz, Aliso Viejo, CA (US); Brian Moran, Rancho Santa Margarita, CA (US); Jeff Taberski, Yorba Linda, CA (US)

(73) Assignee: AVL Mobility Technologies, Inc., Plymouth, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/379,722

(22) Filed: Oct. 13, 2023

(65) Prior Publication Data

US 2024/0039066 A1 Feb. 1, 2024

Related U.S. Application Data

(63) Continuation of application No. 17/016,233, filed on Sep. 9, 2020, now Pat. No. 11,843,097.

(Continued)

(51) Int. Cl.
*H01M 10/48* (2006.01)
*G01R 19/22* (2006.01)
(Continued)

(52) U.S. Cl.
CPC .......... *H01M 10/482* (2013.01); *G01R 19/22* (2013.01); *G01R 31/3842* (2019.01);
(Continued)

(58) Field of Classification Search
CPC .. H01M 10/482; H01M 10/48; H01M 10/425; H01M 10/4257;
(Continued)

(56) References Cited

U.S. PATENT DOCUMENTS

| | | | |
|---|---|---|---|
| 4,522,898 A | 6/1985 | Esrom | |
| 5,392,873 A | 2/1995 | Masuyama et al. | |

(Continued)

FOREIGN PATENT DOCUMENTS

| | | | |
|---|---|---|---|
| AU | 2010298629 B2 | 11/2014 | |
| CN | 102310829 A | 1/2012 | |

(Continued)

OTHER PUBLICATIONS

European Patent Office, Examination Report for Corresponding EP Application No. 20 747 493.3 mailed Nov. 21, 2023.

(Continued)

*Primary Examiner* — Raymond Alejandro
(74) *Attorney, Agent, or Firm* — Honigman LLP; Matthew H. Szalach

(57) ABSTRACT

A cell management module for a power supply module including a plurality of power cells includes at least one cell-sensing circuit and a current measurement circuit connected to the at least one cell-sensing circuit. The at least one cell-sensing circuit includes a transformer having a first winding and a second winding inductively coupled to the first winding. A first sub-circuit of the cell-sensing circuit includes the first winding of the transformer and is operable to selectively pulse a first signal through the first winding. A second sub-circuit of the cell-sensing circuit includes the second winding of the transformer and one of the power cells of the power supply module. The current measurement circuit is connected to the first sub-circuit of the at least one (Continued)

cell-sensing circuit and infers a voltage of the power cell based on a measured current of the first signal.

9 Claims, 15 Drawing Sheets

Related U.S. Application Data

(60) Provisional application No. 62/898,304, filed on Sep. 10, 2019.

(51) Int. Cl.

| | |
|---|---|
| *G01R 31/3842* | (2019.01) |
| *G01R 31/392* | (2019.01) |
| *H01M 10/42* | (2006.01) |
| *H02M 3/335* | (2006.01) |

(52) U.S. Cl.

CPC ........ *G01R 31/392* (2019.01); *H01M 10/425* (2013.01); *H02M 3/33576* (2013.01); *H01M 2010/4271* (2013.01); *H01M 2220/20* (2013.01)

(58) Field of Classification Search

CPC ...... H01M 2010/4271; H01M 2220/20; G01R 31/392; G01R 31/3842; G01R 19/22; H02M 3/33576; H02M 3/33592

See application file for complete search history.

(56) References Cited

U.S. PATENT DOCUMENTS

| | | | | |
|---|---|---|---|---|
| 8,570,047 | B1 * | 10/2013 | Davies | .................. H02J 7/0019 |
| | | | | 324/426 |
| 10,003,112 | B1 | 6/2018 | Boor et al. | |
| 11,843,097 | B2 * | 12/2023 | Falls | ..................... H02J 7/0048 |
| 2003/0203782 | A1 | 10/2003 | Casey et al. | |
| 2004/0200648 | A1 | 10/2004 | Tarasinski et al. | |
| 2008/0231257 | A1 | 9/2008 | Williams | |
| 2011/0075960 | A1 | 3/2011 | White et al. | |
| 2011/0101916 | A1 | 5/2011 | Densham et al. | |
| 2012/0223113 | A1 | 9/2012 | Gaisne et al. | |
| 2012/0321927 | A1 | 12/2012 | Loo et al. | |
| 2013/0192914 | A1 | 8/2013 | Nakamori | |
| 2013/0333959 | A1 | 12/2013 | Wagemann et al. | |
| 2014/0245862 | A1 | 9/2014 | Lang et al. | |
| 2014/0330471 | A1 | 11/2014 | Ozaki | |
| 2015/0357684 | A1 | 12/2015 | Willgert et al. | |
| 2016/0178041 | A1 | 6/2016 | Hagman | |
| 2016/0377162 | A1 | 12/2016 | Ziskovsky et al. | |
| 2017/0114422 | A1 | 4/2017 | Connolly et al. | |
| 2018/0162221 | A1 | 6/2018 | Long et al. | |
| 2018/0337435 | A1 | 11/2018 | Staudenmaier | |
| 2018/0345778 | A1 | 12/2018 | Yamanaka | |
| 2019/0074699 | A1 | 3/2019 | Yano et al. | |
| 2019/0118649 | A1 | 4/2019 | Han | |
| 2019/0120356 | A1 | 4/2019 | Han | |
| 2019/0120357 | A1 | 4/2019 | Han | |
| 2019/0225092 | A1 | 7/2019 | Li et al. | |
| 2020/0062114 | A1 | 2/2020 | Holmes et al. | |
| 2020/0070638 | A1 | 3/2020 | Flaxman | |
| 2020/0384806 | A1 | 12/2020 | Falls et al. | |
| 2021/0102607 | A1 | 4/2021 | Ghatti et al. | |
| 2021/0138885 | A1 | 5/2021 | Engerman | |
| 2021/0178813 | A1 | 6/2021 | Stoecker et al. | |
| 2021/0245599 | A1 | 8/2021 | Mepham et al. | |

FOREIGN PATENT DOCUMENTS

| | | | |
|---|---|---|---|
| CN | 102625961 | A | 8/2012 |
| CN | 103738189 | A | 4/2014 |
| CN | 204011518 | U | 12/2014 |
| CN | 204167947 | U | 2/2015 |
| CN | 105103365 | A | 11/2015 |
| CN | 105745548 | A | 7/2016 |
| CN | 106532176 | A | 3/2017 |
| CN | 107925260 | A | 4/2018 |
| CN | 108215786 | A | 6/2018 |
| CN | 109808479 | A | 5/2019 |
| EP | 1837944 | A2 | 9/2007 |
| EP | 2320537 | A2 | 5/2011 |
| JP | H05-193366 | A | 8/1993 |
| JP | H07-192774 | A | 7/1995 |
| JP | 2001-1774 | A | 1/2001 |
| JP | 2005-231428 | A | 9/2005 |
| JP | 2007-259612 | A | 10/2007 |
| JP | 2011-101572 | A | 5/2011 |
| JP | 2013-157242 | A | 8/2013 |
| JP | 2013-202946 | A | 10/2013 |
| JP | 2013-224139 | A | 10/2013 |
| JP | 2014-147201 | A | 8/2014 |
| JP | 2016-91604 | A | 5/2016 |
| KR | 20120096396 | A | 8/2012 |
| KR | 2013-0092261 | A | 8/2013 |
| KR | 2017-0010727 | A | 2/2017 |
| KR | 2017-0110678 | A | 10/2017 |
| KR | 101902368 | B1 | 10/2018 |
| WO | WO-2008076040 | A1 | 6/2008 |
| WO | WO-2008095313 | A1 | 8/2008 |
| WO | WO-2008111962 | A1 | 9/2008 |
| WO | WO-2011061571 | A1 | 5/2011 |
| WO | WO-2017114422 | A1 | 7/2017 |

OTHER PUBLICATIONS

KIPO office action for corresponding KR Application No. 10-2022-7011195 dated Dec. 9, 2023.

China Intellectual Property Administration, Office Action for Corresponding CN Application No. 202080041487.1 mailed Dec. 29, 2023.

China Intellectual Property Administration, Office Action for Corresponding CN Application No. 202080041504.1 mailed Dec. 29, 2023.

China Intellectual Property Administration, Office Action for Corresponding CN Application No. 202080041516.4 mailed Dec. 26, 2023.

China Intellectual Property Administration, Office Action for Corresponding CN Application No. 202080063157.2 mailed Jan. 9, 2024.

Israel Patent Office, Office Action for Corresponding IL Application No. 291104 mailed May 2, 2024.

Korean Intellectual Property Office, Office Action for corresponding KR Application No. 10-2022-7000166 mailed Apr. 5, 2024.

European Patent Office (ISA), International Search Report and Written Opinion for PCT Application No. PCT/US2020/050080, mailed Nov. 16, 2020.

European Patent Office (ISA), International Search Report and Written Opinion for PCT Application No. PCT/US2020/036029, mailed Oct. 15, 2020.

International Search Report and Written Opinion for Application No. PCT/US2020/036036 dated Oct. 2, 2020.

European Patent Office (ISA), International Search Report and Written Opinion for PCT App. No. PCT/US2020/036236, mailed Nov. 2, 2020.

USPTO Non Final Office Action for U.S. Appl. No. 16/892,410 dated Dec. 29, 2021.

Japanese Patent Office, Office Action for corresponding JP Application No. 2021-572396 mailed Feb. 20, 2023.

European Patent Office, Examination Report for Corresponding EP Application No. 20 747 263.0 mailed Dec. 23, 2022.

China Intellectual Property Administration, First Office Action for Corresponding CN Application No. 20208004487.1 mailed Feb. 22, 2023.

USPTO Non Final Office Action for U.S. Appl. No. 16/893,507 dated Apr. 3, 2023.

Japanese Patent Office, Office Action for corresponding JP Application No. 2021-572398 mailed Mar. 13, 2023.

(56)                    References Cited

OTHER PUBLICATIONS

Japanese Patent Office, Office Action for corresponding JP Application No. 2021-572397 mailed Mar. 20, 2023.
Japanese Patent Office, Office Action for corresponding JP Application No. 2022-541910 mailed Mar. 13, 2023.
Korean Intellectual Property Office, Office Action for corresponding KR Application No. 10-2022-7000166 mailed May 9, 2023.
USPTO Non Final Office Action for U.S. Appl. No. 17/016,233 dated Mar. 3, 2023.
JPO Final Office Action issued for corresponding JP Application No. 2021-572397 dated Aug. 7, 2023.
KIPO office action for corresponding KR Application No. 10-2021-7042902 dated Sep. 6, 2023.

* cited by examiner

POWER SUPPLY CONTROL SYSTEMS AND METHODS

CROSS REFERENCE TO RELATED APPLICATION

This application is a continuation of U.S. patent application Ser. No. 17/016,233, filed on Sep. 9, 2020, now U.S. Pat. No. 11,843,097, issued Dec. 12, 2023, which claims priority under 35 U.S.C. § 119 (e) to U.S. Provisional Patent Application Ser. No. 62/898,304 filed Sep. 10, 2019, the disclosures of which are hereby incorporated by reference their entirety.

FIELD

The present disclosure relates generally to electrical circuits and more particularly to electrical circuits and associated methods for a power supply control system for a vehicle.

BACKGROUND

This section provides background information related to the present disclosure and is not necessarily prior art.

High capacity batteries, such as those implemented in electric vehicles (EVs) or home systems, are typically composed of a plurality of cells that cooperate to deliver power, such as electrical power to propulsion systems of the EVs or electrical systems of a home or business. Due to the high output that is required of these cells, certain complications may arise during operation. For example, the failure of an individual cell or several cells may result in thermal and/or performance issues. Monitoring the state of health (SOH) and/or the state of charge (SOC) of the cells may provide an indication of the status of the cells, thereby reducing the likelihood that the EV or home system is provided with insufficient power during operation.

SUMMARY

This section provides a general summary of the disclosure, and is not a comprehensive disclosure of its full scope or all of its features.

In one configuration, a cell management module for a power supply module including a plurality of power cells is provided. The cell management module includes at least one cell-sensing circuit having (i) a transformer including a first winding and a second winding inductively coupled to the first winding, (ii) a first sub-circuit including the first winding of the transformer and operable to selectively pulse a first signal having a first voltage through the first winding, and (iii) a second sub-circuit including the second winding of the transformer and one of the power cells having a second voltage. A current measurement circuit is connected to the at least one cell-sensing circuit and is configured to measure a current of the first signal received from the first sub-circuit.

The cell management module may include one or more of the following optional features. For example, the first sub-circuit may include a switch operable to pulse the first signal through the first winding of the transformer. The first sub-circuit may include a control circuit operable to selectively open and close the switch. In one configuration, a power source may provide the first signal.

The second sub-circuit may include a rectifier disposed between the second winding and the one of the power cells. In this configuration, the rectifier may be a Schottky diode.

At least one cell-sensing circuit may include a plurality of the cell-sensing circuits, whereby each one of the cell-sensing circuits is connected to the current measurement circuit in parallel. In this configuration, a power source may provide the first signal, with each of the plurality of the cell-sensing circuits being connected to the power source in parallel. Additionally, a controller may be connected to each of the plurality of the cell-sensing circuits and may be configured to selectively permit the first signal through a single one of the cell-sensing circuits while preventing the first signal from flowing through another of the cell-sensing circuits. The controller may be configured to modify at least one of a pulse frequency and a pulse duration of the first signal through the one of the cell-sensing circuits based on a voltage of the one of the power cells of the one of the cell-sensing circuits.

In another configuration, a cell management module for a power supply module including a plurality of power cells is provided. The cell management module includes at least one cell-sensing circuit having (i) a first sub-circuit including a first transformer winding, the first sub-circuit operable to selectively pulse a first signal having a first voltage through the first transformer winding and (ii) a second sub-circuit including a second transformer winding inductively coupled to the first transformer winding and one of the power cells having a second voltage. A current measurement circuit is connected to the first sub-circuit and is configured to infer the second voltage of the one of the power cells based on a measured current of the first signal received from the first transformer winding.

The cell management module may include one or more of the following optional features. For example, the first sub-circuit may include a first switch operable to pulse the first signal through the first transformer winding. In this configuration, the first sub-circuit may include a control circuit operable to selectively open and close the first switch. Further, the second sub-circuit may include a second switch operable to pulse a second signal having the second voltage through the second transformer winding.

In one configuration, the second sub-circuit may include a rectifier disposed between the second transformer winding and the one of the power cells. Further, at least one cell-sensing circuit may include a plurality of the cell-sensing circuits, whereby each of the cell-sensing circuits is connected to the current measurement circuit in parallel. A power source may provide the first signal, with each of the plurality of the cell-sensing circuits being connected to the power source in parallel. Additionally, the plurality of cell-sensing circuits may include at least twenty (20) cell-sensing circuits. A plurality of circuit controllers may be connected to each of the plurality of the cell-sensing circuits and may be configured to selectively permit the first signal through a single one of the cell-sensing circuits while preventing the first signal from flowing through another of the cell-sensing circuits.

In another configuration, a method for managing a plurality of power cells of a power supply module is provided. The method includes (i) providing a first signal having a first current and a first voltage from a first power source, (ii) selectively pulsing the first signal through a first cell-sensing circuit including a transformer having a first winding receiving the first signal and a second winding inductively coupled to the first winding, the first signal inducing a second signal having a second voltage in the second winding, and (iii)

combining the second voltage of the second signal with a cell voltage of a power cell connected to the first cell-sensing circuit, the combined voltage causing a second current to flow through the second winding of the transformer. The method additionally includes measuring a second current of the first signal received from the first winding and inferring the cell voltage of the power cell based on the second current.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected configurations and not all possible implementations, and are not intended to limit the scope of the present disclosure.

Corresponding reference numerals indicate corresponding parts throughout the drawings.

DETAILED DESCRIPTION

Figure 1:
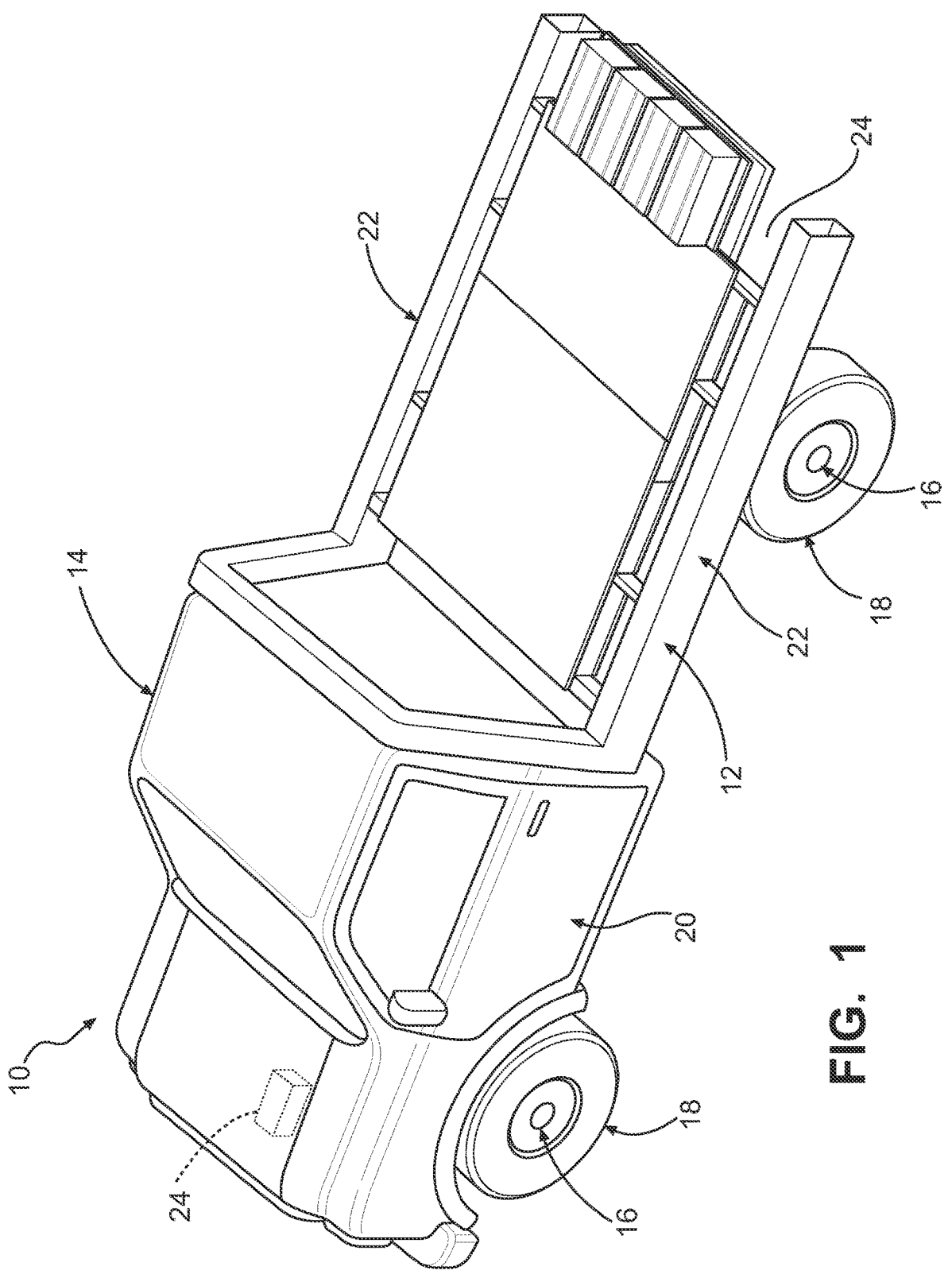
FIG. 1 is a perspective view of a vehicle with portions of the vehicle removed to show a power supply system in accordance with the principles of the present disclosure.

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The terms first, second, third, etc. may be used herein to describe various elements, components, regions, layers and/or sections. These elements, components, regions, layers and/or sections should not be limited by these terms. These terms may be only used to distinguish one element, component, region, layer or section from another region, layer or section. Terms such as "first," "second," and other numerical terms do not imply a sequence or order unless clearly indicated by the context. Thus, a first element, component, region, layer or section discussed below could be termed a second element, component, region, layer or section without departing from the teachings of the example configurations.

Figure 2:
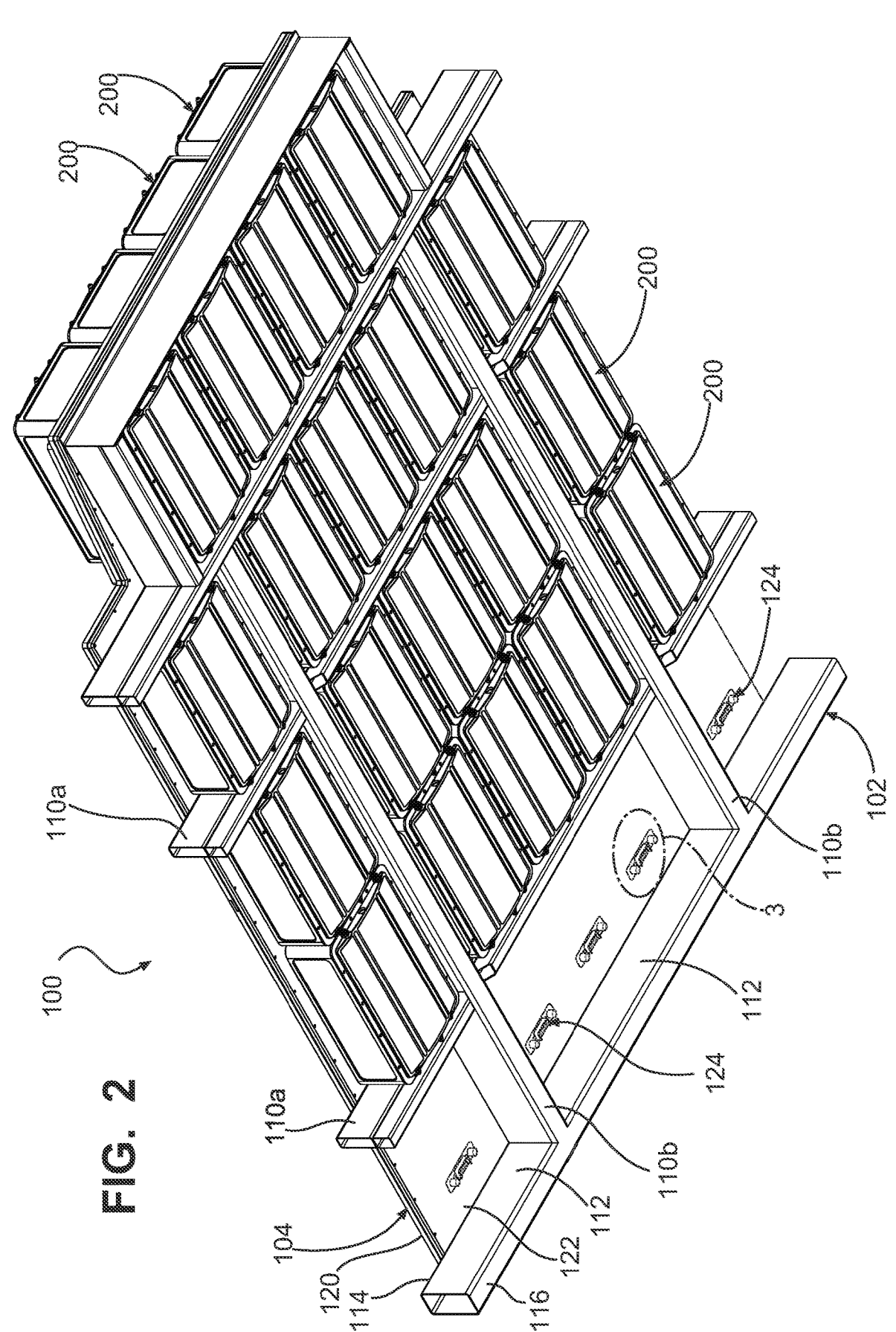
FIG. 2 is a bottom perspective view of the power supply system of the vehicle of FIG. 1.

Referring to FIGS. 1 and 2, a vehicle 10 including a power supply system 100 having a plurality of power supply modules 200 is illustrated. The vehicle includes a chassis 12, a body 14, one or more motors 16, and a plurality of wheels 18 including or coupled to the one or more motors 16. As shown in FIG. 1, portions of the vehicle 10 (e.g., truck bed, tailgate, etc.) are removed to better view the power supply system 100. While the vehicle 10 is generally illustrated as being a commercial utility vehicle, it will be appreciated that the vehicle 10 may include other types of vehicles (e.g., passenger car, van, truck, etc.) within the scope of the present disclosure. In this regard, the chassis 12 may be coupled to, or otherwise support, the body 14, the one or more motors 16, the wheels 18, and the power supply system 100. The body 14 may further define a passenger compartment 20 for housing one or more occupants or users of the vehicle 10.

As illustrated in FIG. 1, the chassis 12 may include a pair of longitudinal frame rails 22. While the chassis 12 is generally shown and described herein as including two rails 22, it will be appreciated that the chassis 12 may include more than two frame rails 22 within the scope of the present disclosure. The first and second longitudinal frame rails 22 may define a void 24 therebetween. As discussed below, the power supply system 100 may be disposed within the void 24. In some implementations, at least a portion of the first frame rail 22 extends in a direction substantially parallel to the second frame rail 22 and to a longitudinal axis of the vehicle 10.

With reference to FIGS. 2-4C, the power supply system 100 may include a power supply frame 102 including a power supply plate 104 and a plurality of power supply modules 200 removably attached to the power supply plate 104. As discussed in greater detail below, the frame 102 is configured to support the power supply plate 104 and the power supply modules 200 between the rails 22 of the chassis 12. The power supply plate 104 is configured to removably connect the plurality of the power supply modules 200 to form a high-voltage power source for the vehicle 10.

The frame 102 of the power supply system 100 includes a plurality of frame members 110a, 110b connected together to form the frame 102. The frame members 110a, 110b include one or more lateral frame members 110a extending perpendicular to the rails 22 of the chassis 12 and one or more longitudinal frame members 110b extending parallel to the rails 22 of the chassis 12. Optionally, one or more of the lateral frame members 110a extends between and connects the chassis rails 22 to each other. The longitudinal frame members 110b extend between and connect adjacent ones of the lateral frame rails 110a.

With reference to FIGS. 1 and 2, the frame members 110a, 110b cooperate to subdivide the space 24 between the rails 22 of the chassis 12 into a plurality power supply module compartments 112 each configured to receive at least one of the power supply modules 200. The frame members 110a, 110b cooperate to define a top side 114 of the frame 102 and a bottom side 116 of the frame 102. The top side 114 of the frame 102 may be described as forming a frame bed 114 for supporting the power supply plate 104 between the rails 22 of the chassis 12.

The bottom side 114 of the frame 102 provides access to each of the power supply module compartments 112 of the frame 102. Accordingly, the power supply modules 200 can be attached to the power supply plate 104 through the bottom side 116 of the frame 102. Each of the frame members 110a, 110b may have a height $H_{110}$ corresponding to a height $H_{200}$ (FIG. 7) of the power supply modules 200 such that the power supply modules 200 are substantially flush with the bottom side 116 of the frame 102 when the power supply modules 200 are installed within the power supply module compartments 112. Accordingly, the power supply modules 200 may provide additional structure along the bottom side of the vehicle 10. Optionally, the vehicle 10 may include a cover panel (not shown) configured to attach to the bottom side 116 of the frame 102 to enclose the power supply modules 200 within the compartments 112.

With continued reference to FIGS. 1 and 2, the power supply plate 104 is supported by the top side 114 of the frame 102 and includes a top side 120 facing away from the frame 102 and a bottom side 122 facing the frame 102. As shown in FIG. 2, the bottom side 122 of the power supply plate 104 is exposed to the power supply module compartments 112 and is accessible through the bottom side 116 of the frame 102.

With reference to FIG. 2-4C, the power supply plate 104 includes a plurality of bus panel ports 124 each configured for electrically coupling a respective one of the power supply modules 200 to the power supply plate 104. The power supply plate 104 may include the bus panel ports 124 on the bottom side 122 (FIG. 2) and on the top side (FIG.

Figure 3:
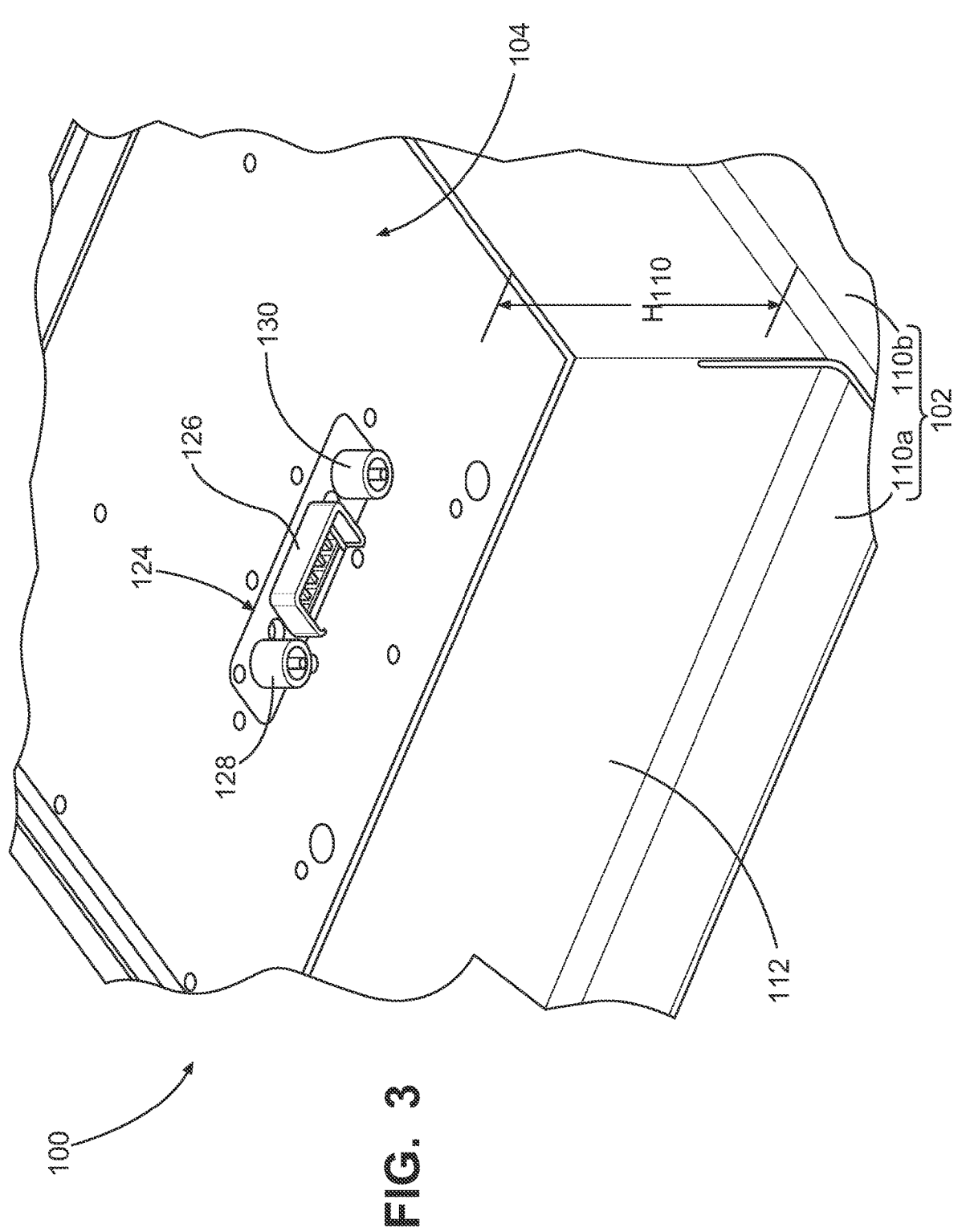
FIG. 3 is an enlarged, fragmentary view of the power supply system of FIG. 2, taken at Area 3 of FIG. 2 and showing a power supply interface.

4A). As best shown in FIG. 3, each of the bus panel ports 124 includes a low-voltage terminal 126 and a pair of high-voltage terminals 128, 130. The high-voltage terminals 128, 130 include a positive high-voltage terminal 128 and a negative high-voltage terminal 130. The high-voltage terminals 128, 130 may be recessed within a housing of the bus panel ports 124 to minimize the likelihood of inadvertent contact with either of the high-voltage terminals 128, 130 during installation and removal of the power supply modules 200.

Figure 4A:
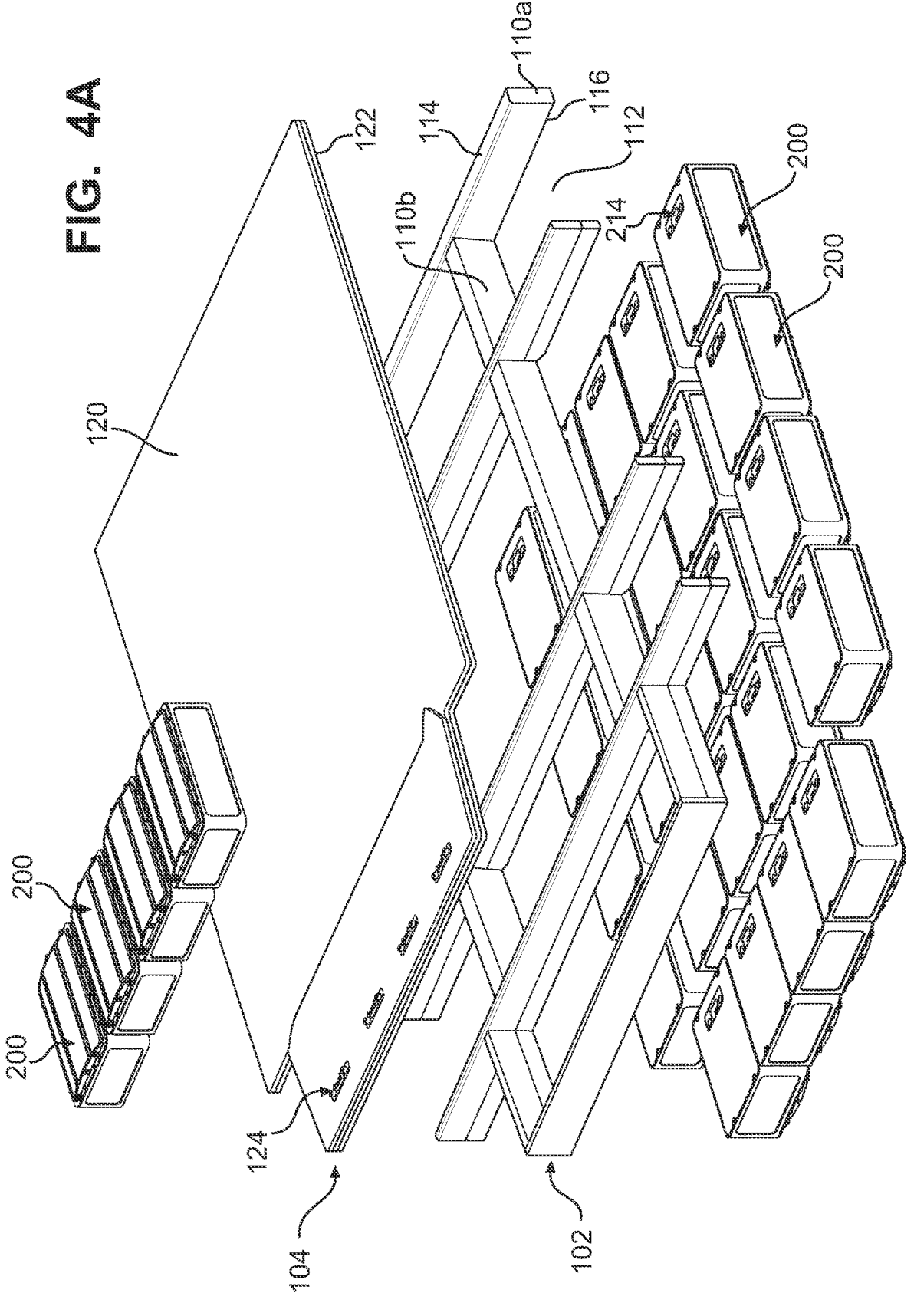
FIGS. 4A-4D are exploded perspective views of the power supply system of FIG. 2.
Figure 4B:
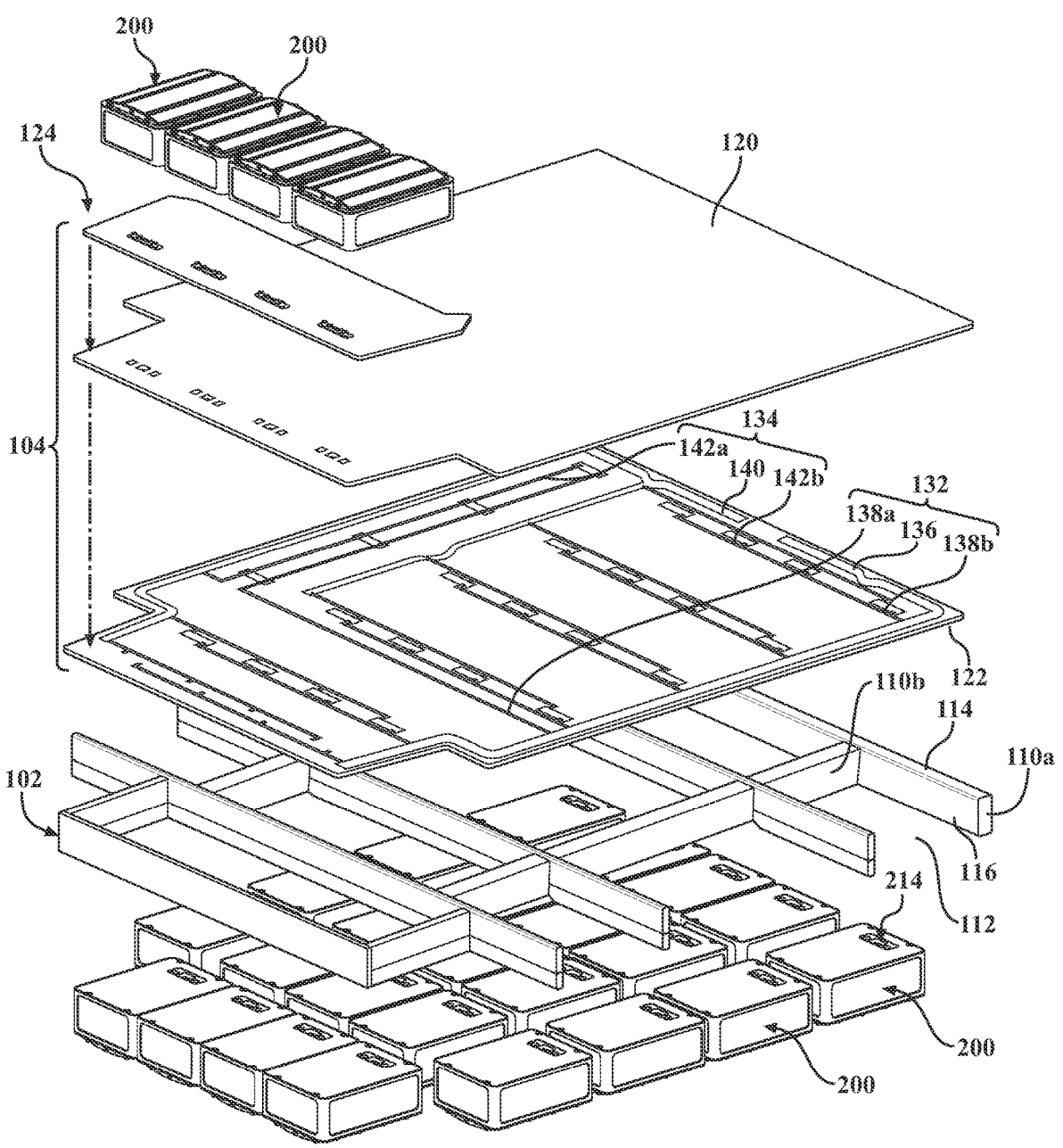

As shown in FIG. 4B, the positive high-voltage terminals 128 are electrically connected to each other through a positive bus network 132 and the negative high-voltage terminals 130 are electrically connected to each other through a negative bus network 134. The positive bus network 132 includes a positive main bus bar 136 and a plurality of positive auxiliary bus bars 138a, 138b. Likewise, the negative bus network 134 includes a negative main bus bar 140 and a plurality of negative auxiliary bus bars 142a, 142b. Each of the auxiliary bus bars 138a, 138b, 142a, 142b couples a plurality of the high-voltage terminals 128, 130 to a corresponding one of the main bus bars 136, 140. In the illustrated example, the power supply plate 104 is configured with serial auxiliary bus bars 138a, 142a that connect a plurality of high-voltage terminals 128, 130 of respective bus panel ports 124 together in series. The power supply plate 104 also includes parallel auxiliary bus bars 138b, 142b that connect a plurality of the high-voltage terminals 128, 130 of respective bus panel ports 124 together in parallel. The types and arrangement of auxiliary bus bars 138a, 138b, 142a, 142b are selected based on the voltage and capacity (e.g., current) of the power supply system 100. Accordingly, more or less of the series auxiliary bus bars 138a, 142a and/or the parallel auxiliary bus bars 138b, 142b may be incorporated into the power supply system 100 depending on a desired voltage or capacity of the power supply system 100.

Each of the main bus bars 136, 140 electrically couples respective ones of the positive and negative auxiliary bus bars 138a, 138b, 142a, 142b in parallel. Thus, the positive serial auxiliary bus bar 138a and the positive parallel auxiliary bus bar 138b are connected to the positive main bus bar 136 in parallel and the negative serial auxiliary bus bar 142a and the negative parallel auxiliary bus bar 142b are connected to the negative main bus bar 140 in parallel. The main bus bars 136, 140 each include a main bus terminal 144, 146 (FIG. 4C) configured for electrically coupling the power supply system 100 to a high-voltage electrical system of the vehicle 10. Optionally, the vehicle 10 may include a high-voltage distribution center (not shown) configured to distribute the high-voltage power from the power supply system 100 to each of the one or more motors 16.

Figure 4C:
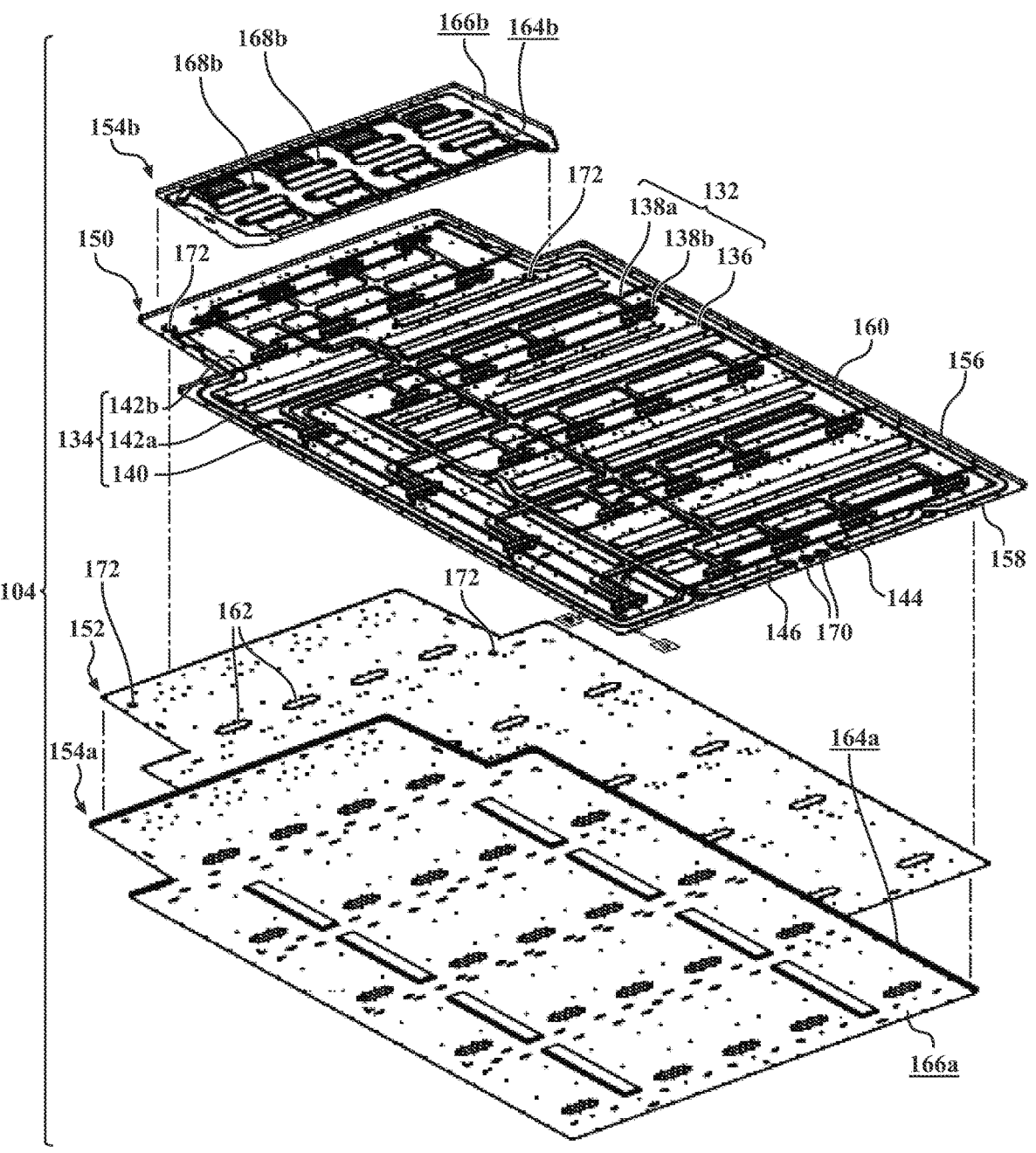
Figure 4D:
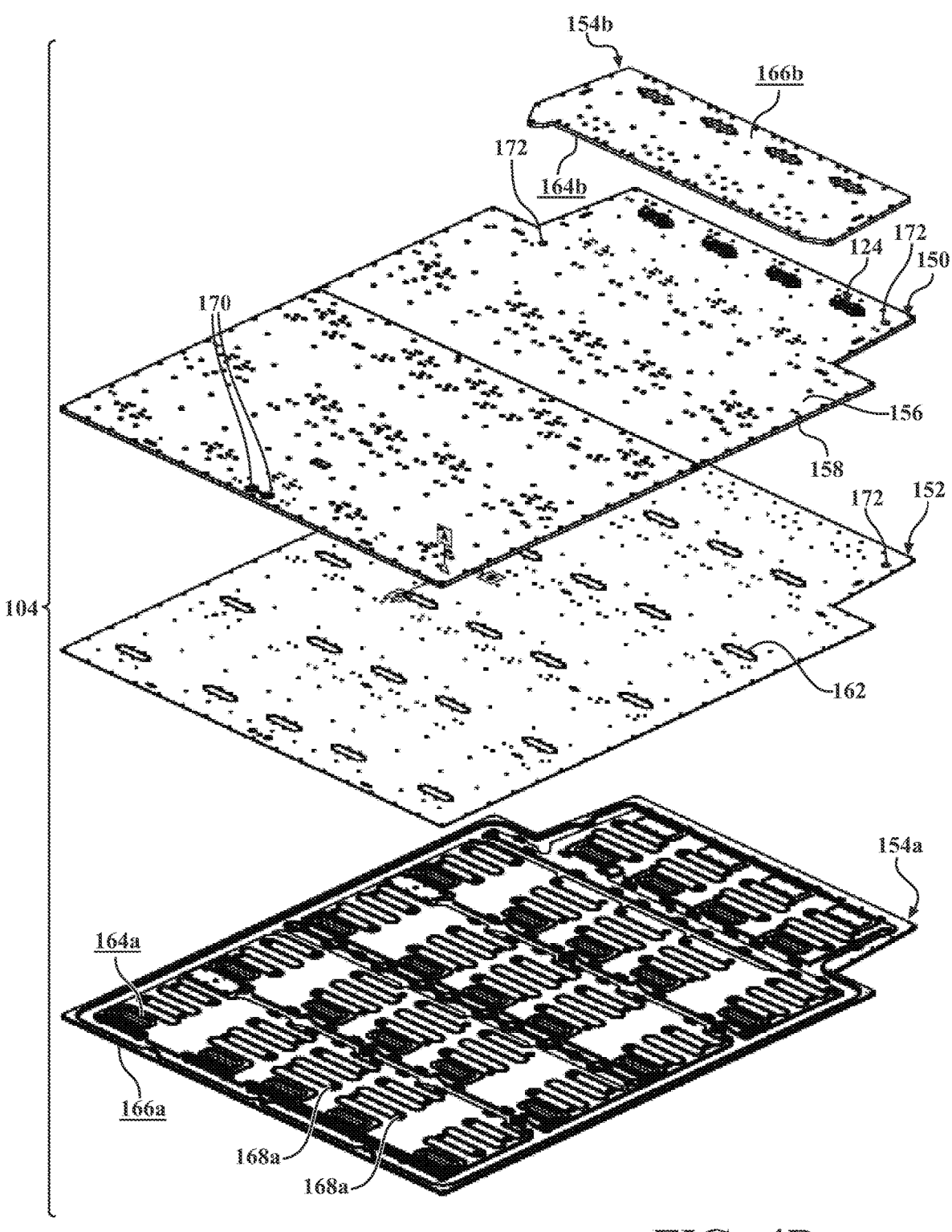
Figure 5:
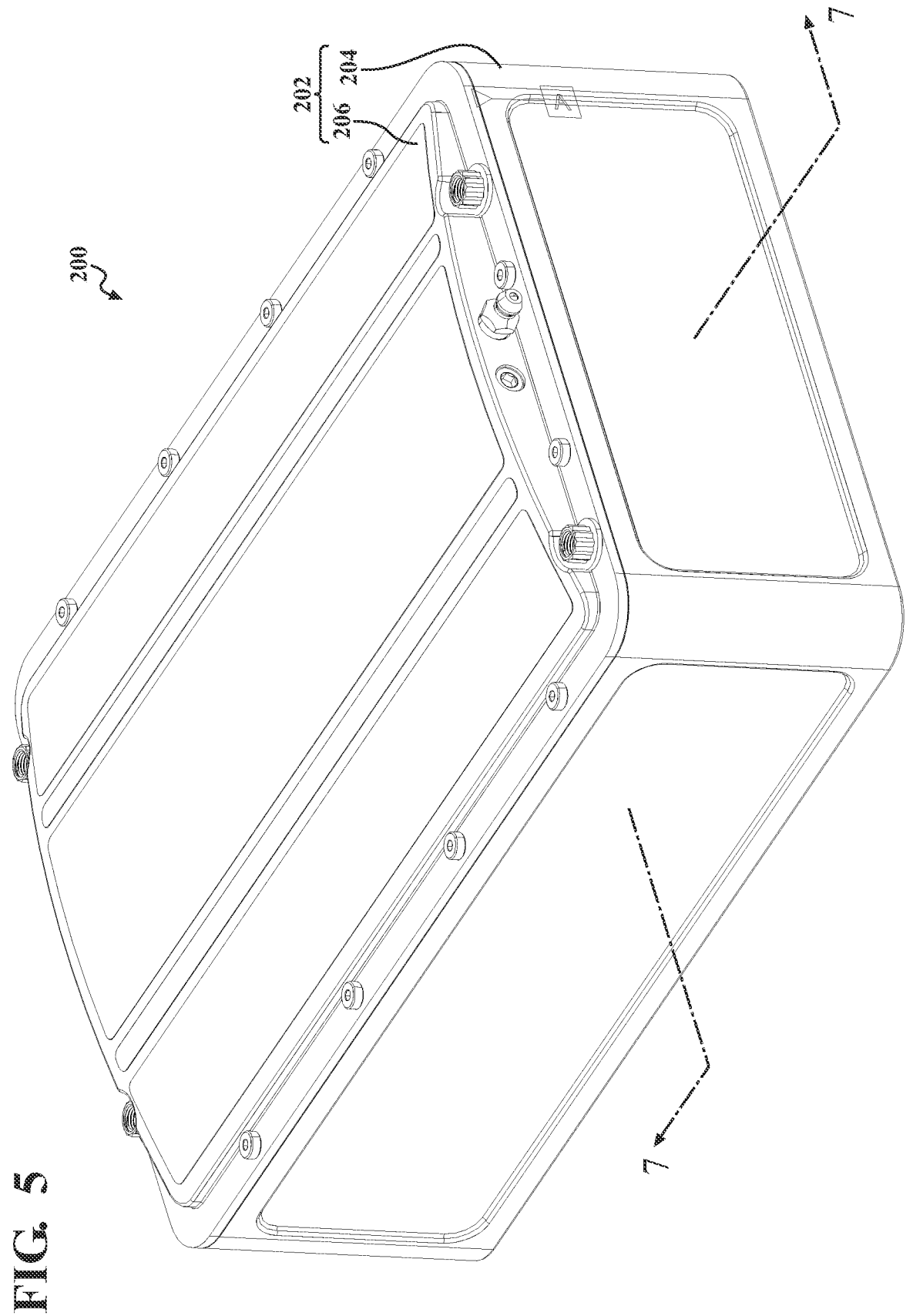
FIG. 5 is a top perspective view of a power supply module of the power supply system of FIG. 2.

With reference to FIGS. 4C and 4D, the power supply plate 104 may include a plurality of panels 150, 152, 154a, 154b stacked in a layered arrangement. The power supply plate 104 includes a power supply bus panel 150, a bus panel cover 152, and a pair of power module mounting panels 154a, 154b disposed on opposite sides of the power supply plate 104. Generally, the power supply bus panel 150 and the bus panel cover 152 include one or more non-conductive materials such that the power supply bus panel 150 provides an insulated enclosure around the high-voltage bus networks 132, 134. The power module mounting panels 154a, 154b provide an attachment interface for each of the power supply modules 200 and may include one or more heat-conductive materials configured to absorb and dissipate thermal energy generated by the power supply modules 200.

With reference to FIG. 4C, the power supply bus panel 150 includes a top side 156 and a bottom side 158 formed on an opposite side than the top side 156. The bus panel ports 124 are attached to the top and bottom sides 156, 158 of the power supply bus panel 150. The bottom side 158 of the power supply bus panel 150 may include a network of recesses 160 configured to receive the positive bus network 132 and the negative bus network 134 within the power supply bus panel 150. The bus panel cover 152 is configured to attach to the bottom side 158 of the power supply bus panel 150 to enclose the high-voltage bus networks 132, 134 within the recesses 160 of the power supply bus panel 150. As shown in FIGS. 4A and 4B, the bus panel cover 152 includes a plurality of apertures 162 each configured to receive a corresponding one of the bus panel ports 124 attached to the bottom side 158 of the power supply bus panel 150. Accordingly, the power supply panel 150 and the bus panel cover 152 are configured to enclose the high-voltage bus networks 132, 134 within an insulated material while providing access to each of the bus panel ports 124.

The lower power module mounting panel 154a and the upper power module mounting panel 154b are disposed on opposite sides of the power supply plate 104 and provide attachment interfaces for the power supply modules 200. Each of the mounting panels 154a, 154b includes an interior surface 164a, 164b facing inwardly towards the power supply bus panel 150 and a respective exterior surface 166a, 166b formed on the opposite side from the interior surface 164a, 164b and facing away from the power supply bus panel 150.

As shown in FIG. 4D, the interior surface 164a of the lower power module mounting panel 154a includes a lower cooling conduit network 168a configured to circulate a heat-transfer fluid along the interior surface 164a of the lower power module mounting panel 154a. Similarly, FIG. 4C shows that the interior surface 164b of the upper power module mounting panel 154b includes an upper cooling conduit network 168b configured to circulate the heat-transfer fluid along the interior surface 164b of the upper power module mounting panel 154b. The lower cooling conduit network 168b and the upper cooling conduit network 168b may include a plurality of cooling channels formed in the interior surfaces 164a, 164b, whereby the cooling conduit networks 168a, 168b are respectively enclosed or covered by the bus panel cover 152 and the power supply bus panel 150 when the power supply plate 104 is assembled. Optionally, the lower and upper cooling conduit networks 168a, 168b may be in fluid communication with a coolant source and with each other through conduits 170, 172 formed through the power supply bus panel 150 and the bus panel cover 152. Accordingly, when the power supply modules 200 are mounted against the exterior surfaces 166a, 166b of the mounting panels 154a, 154b, the mounting panels 154a, 154b will circulate the heat-transfer fluid through the cooling conduit networks 168a, 168b to manage a temperature of the power supply modules 200.

Figure 6:
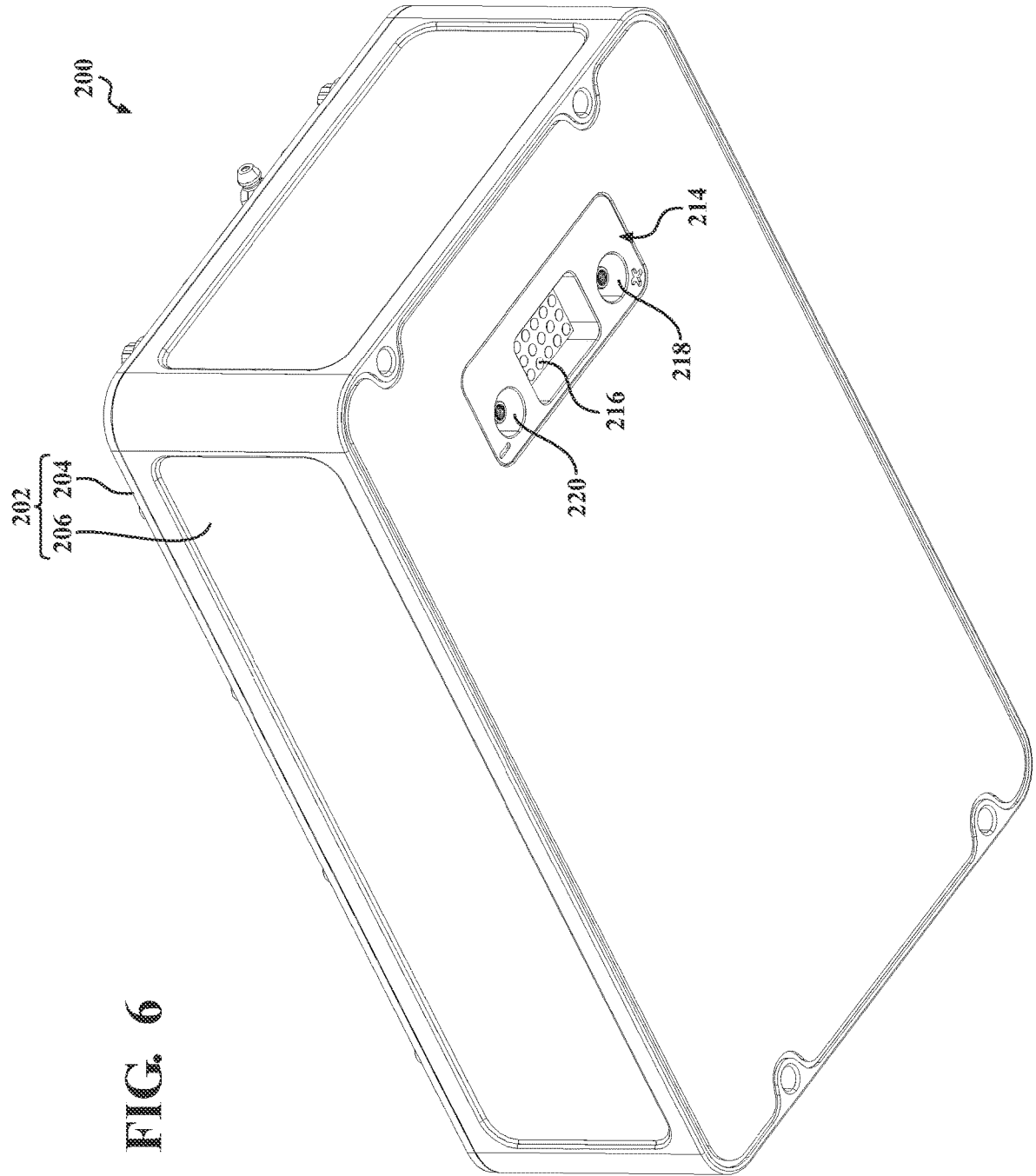
FIG. 6 is a bottom perspective view of the power supply module of FIG. 5.
Figure 7:
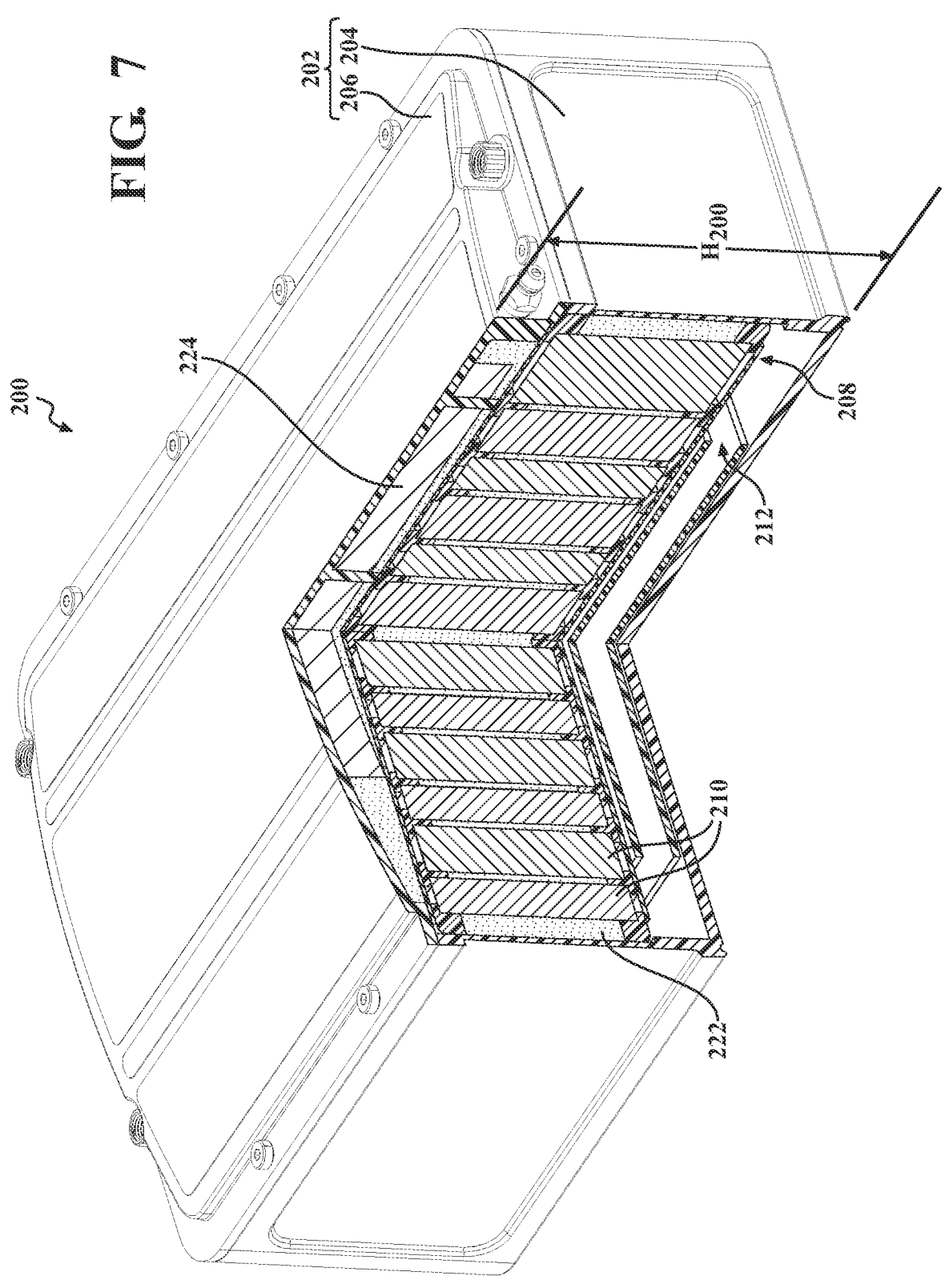
FIG. 7 is a cross-sectional view of the power supply module of FIG. 5, taken along Line 7-7 in FIG. 5.
Figure 8:
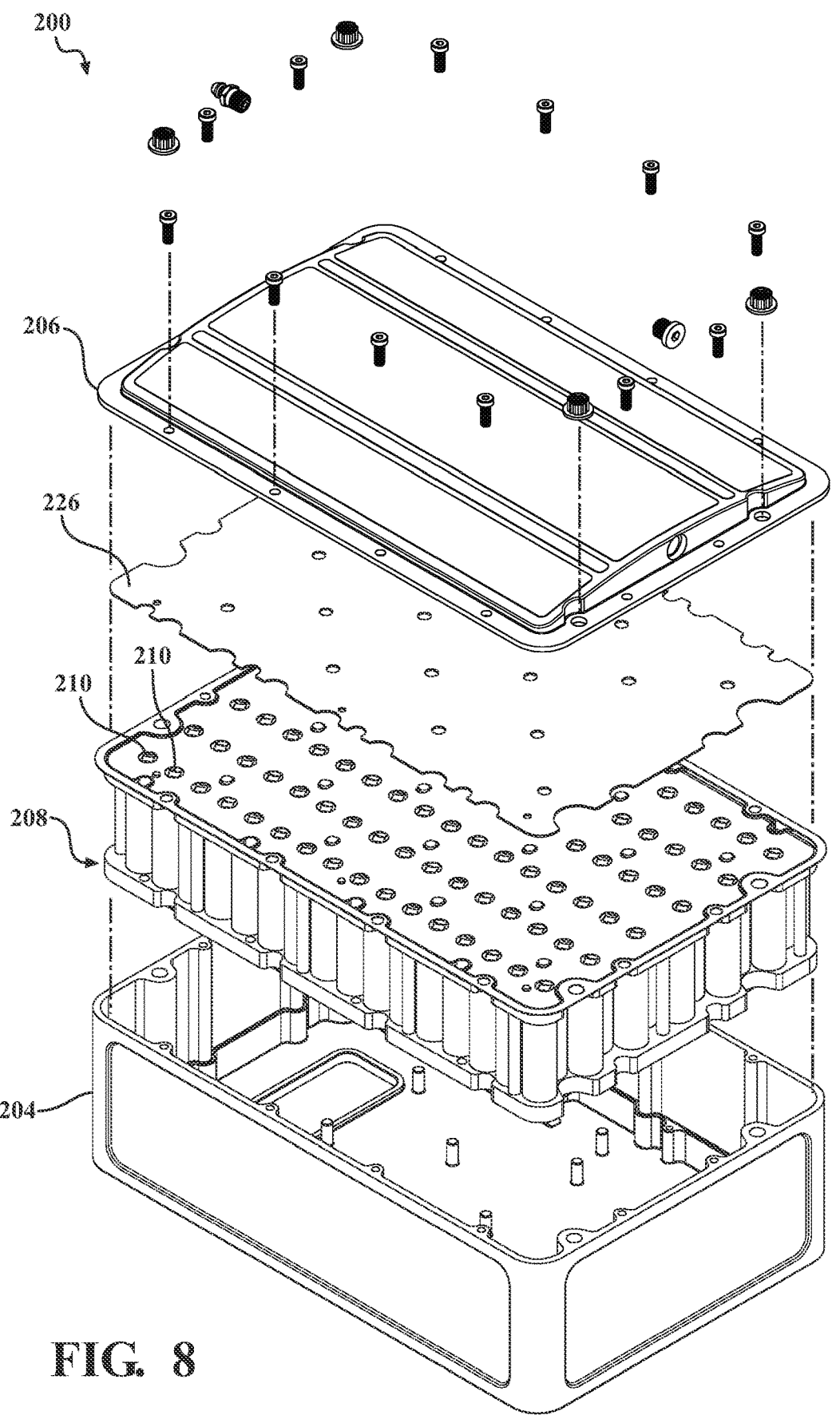
FIG. 8 is a top exploded perspective view of the power supply module of FIG. 5.
Figure 9:
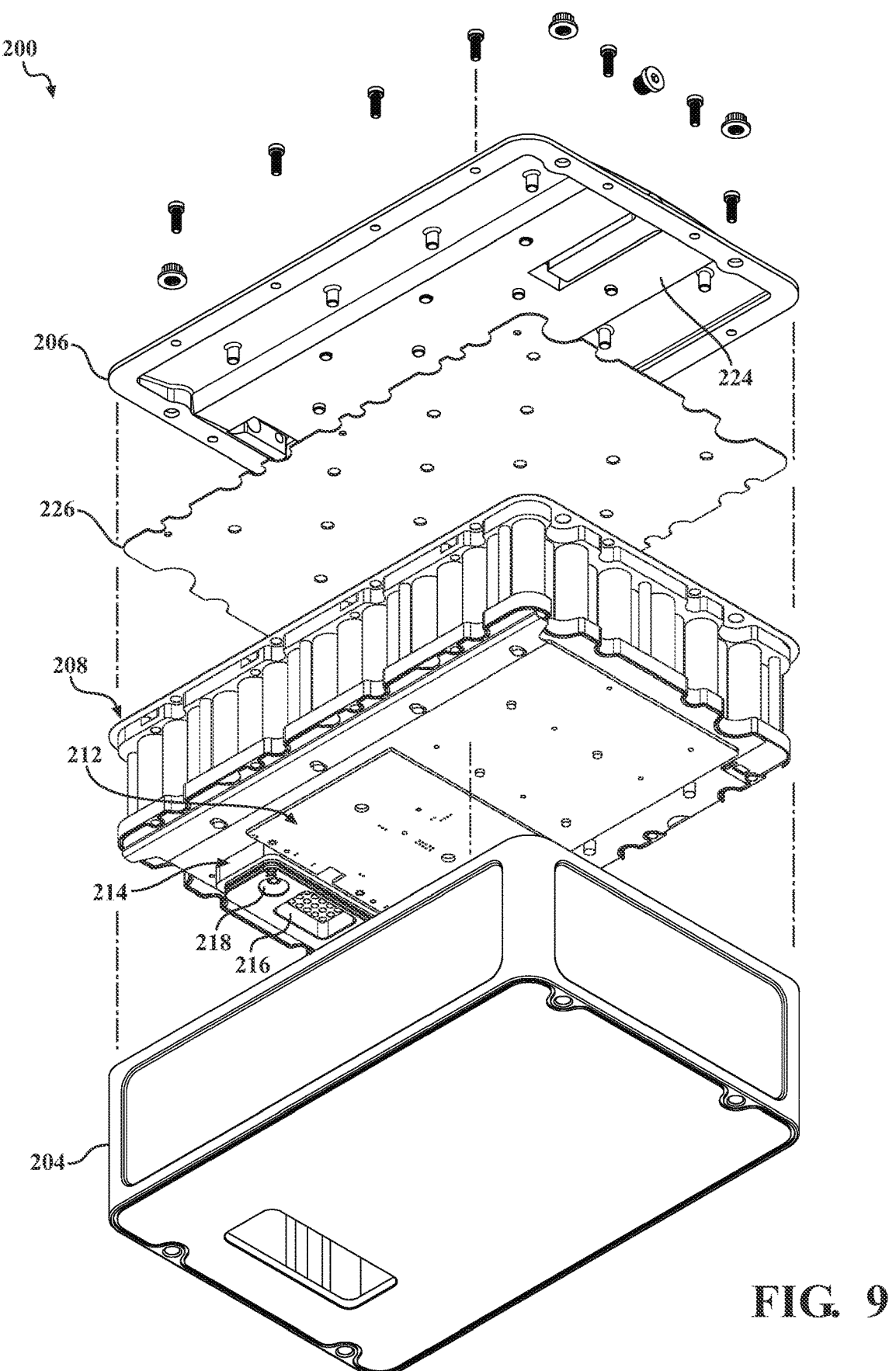
FIG. 9 is a bottom exploded perspective view of the power supply module of FIG. 5.

Turning now to FIGS. 5-9, an example of a power supply module 200 according to the present disclosure is shown. The power supply module 200 includes an enclosure 202 having a lower housing 204 and a cover 206, a power cartridge 208 including a plurality of power cells 210 connected in series, and a controller 212 configured to manage operation of the power supply module 200. Each of the power supply modules 200 is configured as an independent cassette 200 that can be selectively connected and disconnected to the power supply plate 104 to modify or maintain performance of the power supply system 100. Thus, as shown in FIGS. 6 and 9, each power supply module 200 includes a power supply module port 214 configured to connect the power supply module 200 to a corresponding one of the bus panel ports 124 (FIG. 3) of the power supply plate 104. Here, the power supply module port 214 includes a low-voltage terminal 216, a positive high-voltage terminal 218, and a negative high-voltage terminal 220 each configured to interface with a corresponding one of the terminals 126, 128, 130 of one of the bus panel ports 124 when the power supply module 200 is attached to the power supply plate 104.

As shown in FIG. 7, the power cartridge 208 includes a plurality of power cells 210, which are connected to each other in series. For instance, the power cartridge 208 of the present example includes 192 power cells arranged in series. Accordingly, the voltages of the power cells 210 are cumulative and combine to provide the power supply module 200 with a high-voltage output equal to the sum of the voltages of the battery cells 210. As discussed in greater detail below, the power supply module 200 may include any number of power cells 210 arranged in series to provide a desired high-voltage output. Each power cell 210 may be a battery including any suitable composition, such as, for example, lithium-ion, lead acid, nickel-cadmium, nickel-metal-hydride, etc. The power cells 210 may deliver power to, for example, components of an electric vehicle (EV), such as a propulsion system, or an electrical system of a home or business.

The power cells 210 may be encapsulated within a heat-transfer material 222, such as a fluid or a solid material having a relatively high heat transfer coefficient. In some examples, the heat-transfer material 222 includes an oil disposed within the cassette and surrounding each of the power cells 210. The heat-transfer material 222 may be in contact with the lower housing 204 such that thermal energy can be transferred to or from the heat-transfer material 222 through the housing 204 via the heat-transfer fluid circulating through the corresponding cooling conduit network 168a, 168b of the respective mounting panel 154a, 154b. For instance, thermal energy generated by the power cells 210 may be absorbed by the heat-transfer material 222 and transferred to the heat-transfer fluid through the mounting interface between the housing 204 and the respective mounting panel 154a, 154b. In other scenarios, such as in cold climates, the heat-transfer fluid may be heated by an auxiliary heating source and transfer thermal energy to the power cells 210 through the mounting interface and the heat-transfer material 222, thereby maintaining the power cells 210 above a threshold operating temperature.

In some examples, the enclosure 202 may include a pressure buffer 224 configured to accommodate thermal expansion of the heat-transfer material 222 within the enclosure 202 to ensure maximum contact between the heat-transfer material 222 and the power cells 210 while preventing a pressure of the heat-transfer material 222 from exceeding a threshold burst pressure for the enclosure 202. The pressure buffer 224 may include a compressible bladder or closed-cell foam pad disposed within the cover 206. Here, the pressure buffer 224 is configured to compress as the heat-transfer material 222 heats and expands, thereby maintaining a substantially constant pressure within the enclosure 202. Alternatively, the pressure buffer 224 may include a retractable piston or valve (neither shown) that is operable to expose a passage or reservoir for accumulating the expanded heat-transfer material 222. As shown in FIG. 8, the enclosure 202 may include a separator plate 226 configured to enclose the heat-transfer material 222 within the power cartridge 208.

Optionally, the enclosure 202 may include an internal circulation pump (not shown) situated within the dome-shaped cover 206. When present, the circulation pump circulates the heat-transfer material within the enclosure to maximize thermal energy removal from the power supply module 200. The circulation pump may operate constantly or may be thermostatically controlled, such that the circulation pump of each power supply module 200 only operates when a temperature of the heat-transfer material 222 satisfies a temperature threshold.

Figure 10:
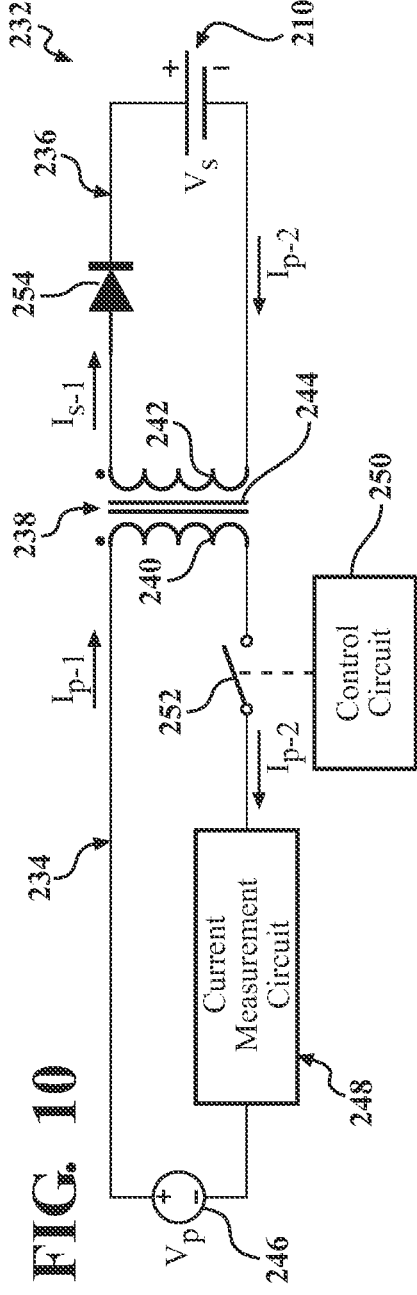
FIG. 10 is a schematic diagram of an example cell-sensing circuit of a power supply module according to the principles of the present disclosure.
Figure 11:
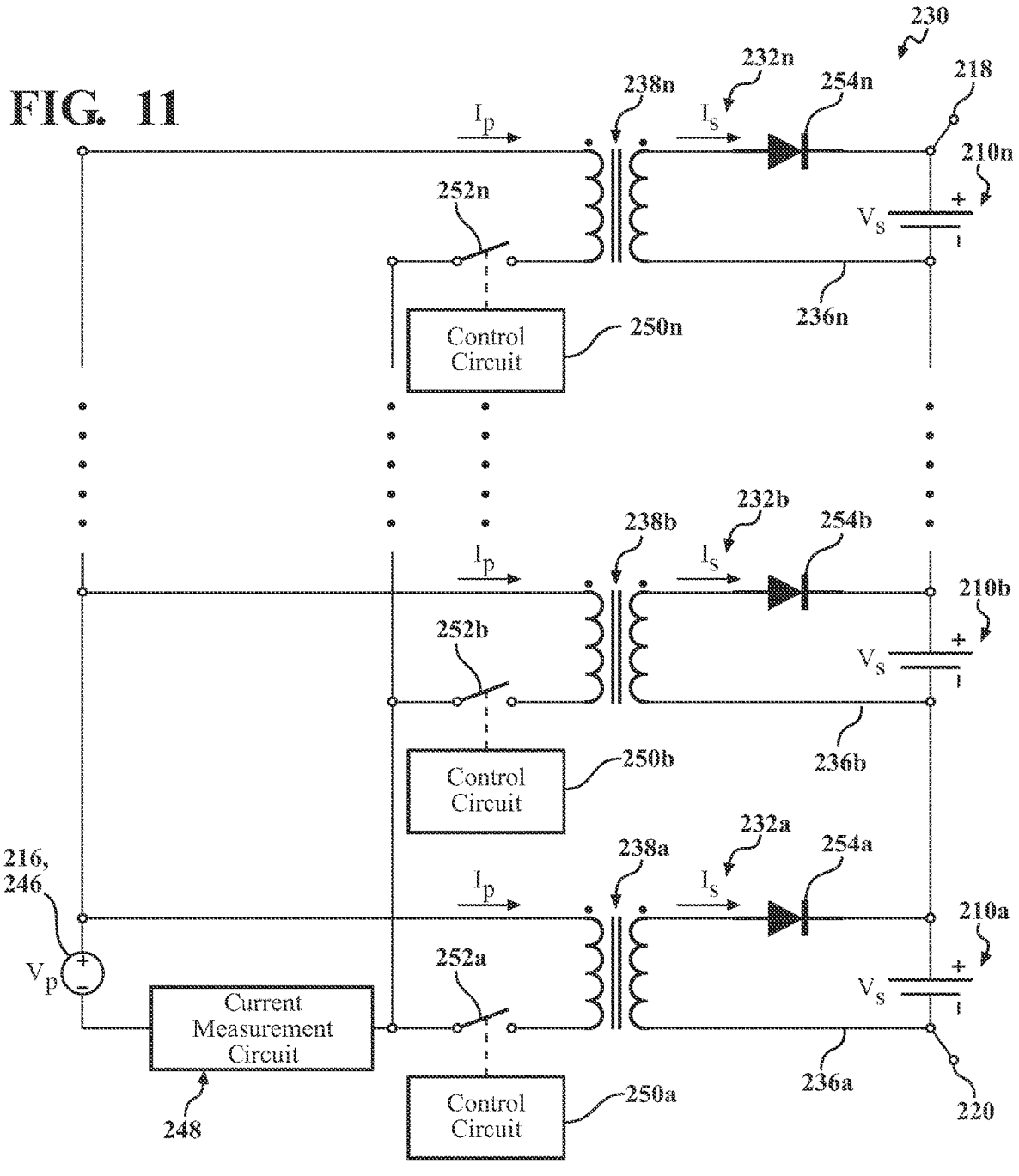
FIG. 11 is a schematic diagram of an example cell management module of a power supply module according to the principles of the present disclosure.

The controller 212 of each power supply module 200 is configured to actively sense and balance the charge state of each of the power cells 210. Referring to FIGS. 10 and 11, electrical circuit schematics representing a cell management module 230 of the controller are generally shown. As discussed in greater detail below, the cell management module 230 (FIG. 11) is connected to a plurality of the power cells 210 in parallel through respective cell-sensing circuits 232 (FIG. 10). Thus, although the power cells 210 are connected to each other in series within the power cell 210 to provide the terminals 218, 220 of the power cell 210 with a relatively high voltage equal to the sum of the voltages of the power cells 210, the cell-sensing circuits 232 are independently connected to each power cell 210 in parallel. Isolating the cell-sensing circuits 232 allows the cell-sensing circuits 232 to be implemented using low-voltage components capable of managing the voltage of each power cell 210 individually. Using low-voltage components is advantageous, as the costs associated with constructing the cell management module 230 can be reduced relative to comparable cell management circuits requiring higher voltage components.

With reference to FIGS. 10 and 11, an example of an isolated cell-sensing circuit 232 is provided. The cell-sensing circuit 232 includes a primary circuit 234 and a secondary circuit 236 inductively connected to each other by a transformer 238. Each transformer 238 includes a primary coil or winding 240 and a secondary coil or winding 242 each wrapped around a core 244. The core 244 may be formed of any suitable material, such as iron, ferrite, silicon steel, etc. The transformer 238 may be disposed on a printed circuit board (PCB) of the controller 212. When a plurality of the cell-sensing circuits 232a-232n are implemented (FIG. 11), all of the transformers 238a-238n may be disposed on the same controller 212.

As shown in FIG. 10, the primary circuit 234 includes or is connected to a primary power source 246 that generates or provides a primary signal $I_P$ and a current measurement circuit 248 that is configured to measure the current of the primary signal $I_P$, as discussed in greater detail below. The primary power source 246 may include a low-voltage (12V to 48V) power supply reservoir ($V_P$). As shown in FIG. 11, when a plurality of the cell-sensing circuits 232a-232n are implemented in the cell management module 230, all of the cell-sensing circuits 232a-232n may be connected to the same primary power source 246 and current measurement circuit 248. Thus, the cell-sensing circuits 232a-232n are configured to share a single current measurement circuit 248, which minimizes complexity and costs of the cell management module 230.

To facilitate isolated current measurement across a plurality of cell-sensing circuits 232, 232a-232n using a single current measurement circuit 248, each primary circuit 234, 234a-232n also includes an independent control circuit 250, 250a-250n operable to selectively open and close a switch 252, 252a-252n implemented in the respective primary circuit 234, 234a-232n. In other words, the control circuit 250, 250a-250n is configured to selectively permit the flow of the primary current signal $I_P$ through a primary circuit 234, 234a-234n of a cell-sensing circuit 232, 232a-232n associated with one of the power cells 210, 210a-210n. The control circuit 250, 250a-250n may be implemented on the controller 212 of the power control module 200. When a plurality of the power cells 210a-210n are included in a power control module 200, the controller 212 of the power control module 200 includes a control circuit 250a-250n associated with each one of the cell-sensing circuits 232a-232n, as shown in FIG. 11.

In some implementations, the switches 252, 252a-252n are transistors such as metal-oxide-semiconductor field-effect transistors (MOSFETs), field effect transistors (JFETs), bipolar junction transistors (BJTs), etc. In other implementations, the switches 252, 252a-252n may be relays or any other suitable switches. In the illustrated example, the switches are be disposed downstream of the primary winding 240 of the transformer 238, 238a-238n and upstream of the current measurement circuit 248. However, the switch 252, 252a-252n of each primary circuit 234, 234a-234n may be implemented anywhere along the primary circuit 234, 234, 234a-234n.

The current measurement circuit 248 is configured to determine a state of health (SOH) and a state of charge (SOC) of each of the power cells 210, 210a-210n. To determine the SOH and/or SOC of a different cell 210, 210a-210n, e.g., based on the current flowing through the primary winding 240, the switch 252, 252a-252n associated with that power cell 210, 210a-210n is activated such that the pulsed current sent by the current measurement circuit 248 is configured to flow through that specific primary winding 240. In this configuration, the current measurement circuit 248 may monitor the SOH and SOC of the individual power cells 210, 210a-210n such that any changes may be identified and any corrective action may be taken if necessary. For example, if it is determined that the SOH and/or SOC of a specific power cell 210, 210a-210n is below a predetermined threshold value, then that power cell 210, 210a-210n may be repaired, removed, and/or replaced. Such corrective action may occur manually or automatically.

With respect to the SOH of each of the power cells, the current measurement circuit 248 is configured to continuously sense or receive an overall voltage of the power supply module 200 and compare the overall voltage of the power supply module 200 over time. For example, when a cell sensing circuit 232 is pulsed, a voltage change $\Delta V_{cell}$ corresponding to the product of the current (I) and the resistance (R) of the particular power cell 210 of the cell sensing circuit is observable in the overall voltage of the power supply module 200. Here, each cell sensing circuit 232 of the cell management module 230 is pulsed individually to determine an overall voltage change $\Delta V_{module}$ of the power supply module 200. This overall voltage change $\Delta V_{module}$ is proportional to the DC resistance of all of the power cells 210 of the power supply module 200 and can be utilized in determining the SOH of the power supply module 200.

To target a specific power cell 210, 210a-210n, one of the switches 252, 252a-252n associated with the targeted power cell 210, 210a-210n is closed and the remaining switches 252, 252a-252n remain open such that the primary signal $I_P$ only flows through the cell-sensing circuit 232, 232a-232n associated with the targeted power cell 210, 210a-210n. For example, if the second power cell 210b is targeted, then the second switch 252b would be closed such that the primary signal $I_P$ flows through the primary circuit 234b. As described below, the current measurement circuit 248 is capable of determining the current of the primary signal $I_P$ through the active primary winding 240 based on the voltage drop across a current-sense resistor, i.e., using Ohm's law. Alternatively, the current measurement circuit 248 may determine the current in any suitable manner. The current measurement circuit 248 may gather additional data, including data related to phase angle, primary current integration, temperature, calibration parameters, etc. The current measurement circuit 248 is capable of (i) converting the analog signal(s) of the pulsed current and any other data into digital signal(s) and (ii) sending these digital signal(s) to a digital filter/protect/drive circuit.

With continued reference to FIGS. 10 and 11, the secondary circuit 236, 236a-236n of each cell-sensing circuit 232 includes the secondary winding 242 of the transformer 238, 238a-238n, a rectifier 254, 254a-254n, and one of the power cells 210, 210a-210n all arranged in series along the secondary circuit 236, 236a-236n. As discussed above, the secondary circuit 236, 236a-236n is inductively connected to the primary circuit 234 through the secondary winding 242 of the transformer 238, 238a-238n. Accordingly, the DC primary current signal $I_P$ of the primary circuit 234, 234a-234n is transformed to an AC secondary current signal $I_s$ by the transformer 238, 238a-238n, and must be processed by the rectifier 254, 254a-254n upstream of the power cell 210 to convert the secondary signal $I_S$ from an AC signal to a DC signal compatible with the DC voltage of the power cell 210. In some examples, the rectifier 254 is implemented as a Schottky diode, which advantageously provides rectification in environments where fast recovery and low voltage drop are desirable.

As discussed herein, the primary signal $I_P$ received from the power primary power source 246 may be designated as the base or initial primary signal $I_{P-1}$ while the primary signal $I_P$ downstream of the transformer may be designated as the modified or adjusted primary signal $I_{P-2}$. Likewise, the secondary signal $I_S$ generated by the secondary winding 242 may be designated as the base or initial secondary signal $I_{S-1}$ while the secondary signal $I_S$ downstream of the power cell 210 may be designated as the modified or adjusted secondary signal $I_{S-2}$. Adjustment or modification simply refers to a change in voltage and/or current that may be imparted on the signals $I_P$, $I_S$ as the signals $I_P$, $I_S$ respectively pass through the primary winding 240 and the power cell 210.

In use, a voltage of the power cell 210 associated with a respective one of the cell-sensing circuits 232, 232a-232n is inferred by the current measurement circuit 248 based on a measured value of the primary signal $I_P$ of the primary circuit 234, as discussed in greater detail below. To measure the voltage of one of the power cells 210, 210a-210n, the switch 252, 252a-252n of the primary circuit 234, 234a-234n is pulsed by the controller 212 to permit flow of the primary signal $I_P$ through the primary circuit 234, 234a-234n. Here, a single switch 252, 252a-252n of the cell management module 230 is closed at a time to pulse the primary circuits 234, 234a-234n in isolation, thereby allowing the current measurement circuit 248 to independently infer the voltage of the power cell 210, 210a-210n associated with each cell-sensing circuit 232, 232a-232n.

Referring to FIG. 10, the method of inferring a voltage of a power cell 210 within a generic one of the cell-sensing circuits 232 is shown. Each of the cell-sensing circuits 232a-232n of FIG. 11 operates the same as the generic cell-sensing circuit 232 when the switch 252a-252n of the respective primary circuit 234a-234n associated with the power cell 210 is closed. As provided above, when the controller 212 targets a particular power cell 210 for sensing and/or balancing, the switch 252 of the primary circuit 234 associated with the power cell 210 is closed to allow a pulse of the primary signal $I_P$ to flow through the primary circuit 234.

A duration of the pulse of the primary signal $I_P$ is selected to provide a desired balance between maximizing primary signal $I_P$ measurement and minimizing an effect of the primary signal $I_P$ on the secondary circuit 236 and the power cell 210. For instance, if the pulse duration is too short, the current measurement circuit 248 may be unable to accurately measure the primary signal $I_P$ and, as a result, may be unable to infer the SOH or SOC of the power cell 210 of the corresponding secondary circuit 236. Conversely, if the pulse duration is too long, the primary signal $I_P$ may undesirably influence or effect the secondary signal $I_S$ and/or the power cell 210. In some examples, a pulse duration of the primary signal $I_P$ for cell sensing functions is 10 microseconds. However, as discussed below, the pulse duration may be adjusted for other functions, such as balancing of power cell voltages.

As the base primary signal $I_{P-1}$ flows through the primary winding 240 of the transformer 238, a magnetic flux is generated in the transformer core 244. As provided above, the secondary winding 242 is also connected to the transformer core 244 such that the secondary winding 242 is inductively connected to the primary winding 242. Accordingly, the magnetic flux generated by the base primary signal $I_{P-1}$ induces a secondary voltage in the secondary winding 242 that corresponds to the base secondary signal $I_{S-1}$. As provided above, the base secondary signal $I_{S-1}$ may be output from the transformer as an AC voltage that is incompatible with the DC voltage of the power cell 210. Thus, the base secondary signal $I_{S-1}$ passes through the rectifier 254 to convert the base secondary signal $I_{S-1}$ from an AC voltage to a DC voltage. The rectifier 254 (i.e., a Schottky diode) may cause the voltage of the base secondary signal $I_{S-1}$ to drop as the base secondary signal $I_{S-1}$ passes through the rectifier 254. The base secondary signal $I_{S-1}$, now in DC voltage, then travels to the targeted power cell 210.

When the voltage of the converted base secondary signal $I_{S-1}$ (i.e., the secondary signal $I_S$ after the Schottky diode) is greater than the voltage of the power cell 210, a current will start to flow through the secondary circuit 236. In other words, when the voltage of the base secondary signal $I_{S-1}$ is greater than the sum of the voltage drop associated with the rectifier (i.e., the Schottky diode drop) and the voltage of the power cell 210, the difference in the voltage results in the modified secondary signal $I_{S-2}$ flowing from the power cell 210 to the secondary winding 242 of the transformer 238.

Whenever a current flows through a wire, a magnetomotive force (MMF) is generated by the wire. Thus, the current of the base primary signal $I_{P-1}$ generates a primary MMF in the primary winding 240. Likewise, when the modified secondary signal $I_{S-2}$ flows through the secondary windings 242, a secondary MMF is produced within the secondary winding 242. The secondary MMF may act as a "back" MMF that counteracts or opposes the primary MMF of the primary winding 240, thus reducing the voltage of the primary signal $I_P$ from a first voltage associated with the base primary signal $I_{P-1}$ to a second voltage associated with the modified primary signal $I_{P-2}$. In accordance with Kirchhoff's voltage law, a magnitude and a phase angle of a primary voltage of the primary windings 240 must remain the same, thus, the current of the primary signal $I_P$ changes to account for the voltage change imparted by the secondary MMF of the secondary winding 242. For example, power cells 210, 210a-210n having a lower voltage results in a higher secondary MMF as the difference between the voltage of the power cell 210 and the voltage of the base secondary signal $I_{S-1}$ is greater. As a result, a current of the modified primary signal $I_{P-2}$ will be relatively high to account for the large secondary MMF. Conversely, power cells 210, 210a-210n having a higher voltage result in a lower secondary MMF and, thus, a modified primary signal $I_{P-2}$ having a relatively low current.

As introduced above, the current measurement circuit 248 is configured to measure the current of the modified primary signal $I_{P-2}$ associated with a targeted power cell 210. When the current of the modified primary signal $I_{P-2}$ is relatively high (i.e., the secondary MMF is high as a result of low voltage of the power cell 210), then the current measurement circuit 248 infers that the voltage of the power cell 210 is relatively low. Conversely, when the adjusted current of the modified primary signal $I_{P-2}$ is relatively low (i.e., the secondary MMF is low as a result of high voltage of the power cell 210), then the current measurement circuit 248 infers that the voltage of the power cell 210 is relatively high. The current measurement circuit 248 may be configured (i.e., calibrated) such that the current measurement circuit 248 can infer an actual voltage of the power cell 210 based on the measured current of the modified primary signal $I_{P-1}$.

In addition to measuring the state of health (SOH) and state of charge (SOC) of each power cell 210, the cell management module 230 may be configured to actively balance the voltage of each of the power cells 210. For example, each time a cell-sensing circuit 232 is pulsed (e.g., during measurement) energy is transferred from the primary circuit 234 to the secondary circuit 236. To provide more energy from the primary circuit 234 to the secondary circuit 236, the frequency and/or duration of the pulses can be increased. For example, pulse duration may be increased from the 10 microsecond duration used for sensing to a 15 microsecond duration to provide 50% more energy from the primary circuit 234 to the secondary circuit 236. Additionally or alternatively, the primary circuit 234 be pulsed more frequently. Actively balancing the individual power cells 210 advantageously ensures that each power cell 210 can be fully charged over the life of the power supply module 200.

Figure 12:
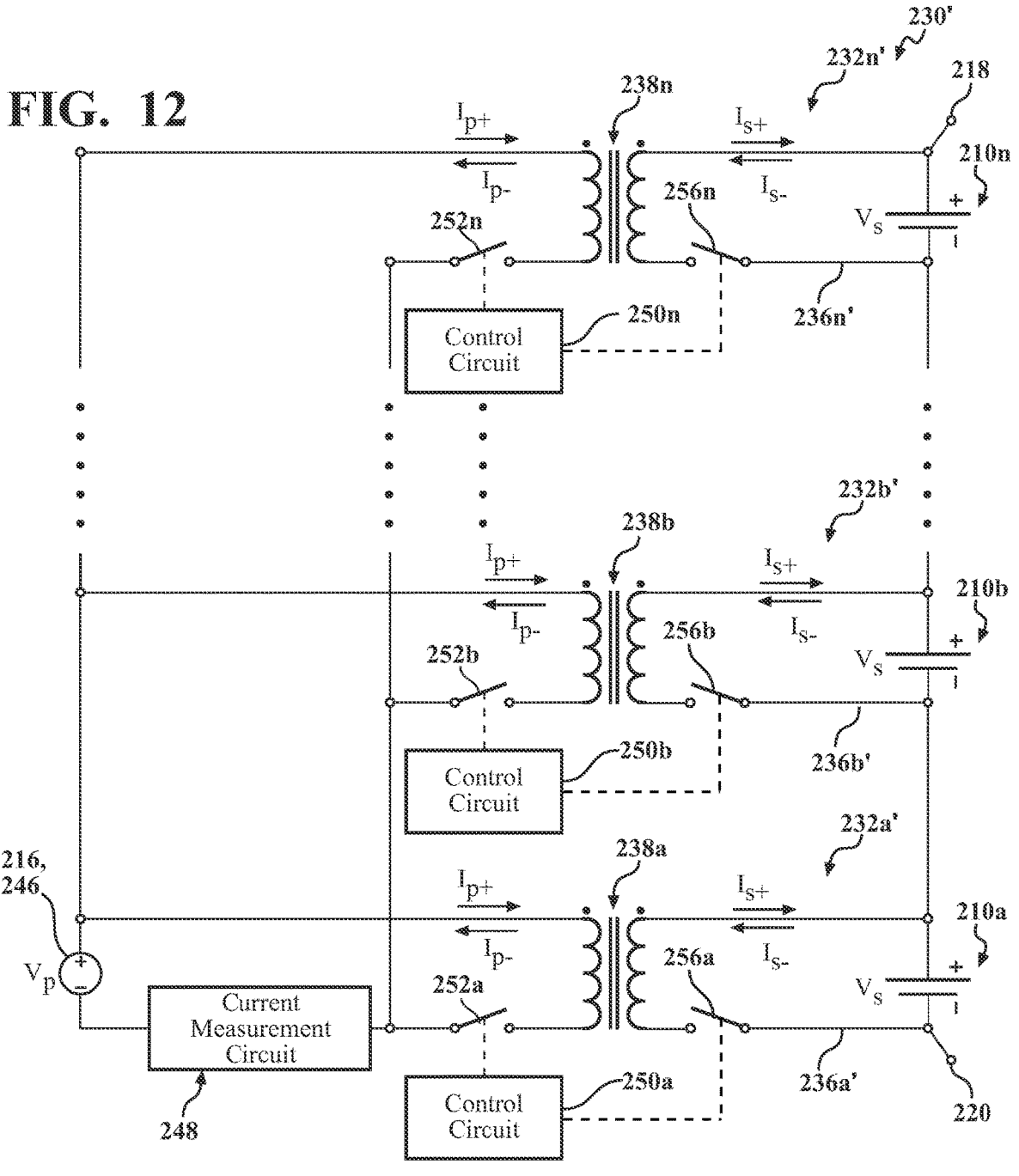
FIG. 12 is a schematic diagram of another example cell management module of a power supply module according to the principles of the present disclosure.

With particular reference to FIG. 12, a cell management module 230' is provided and includes a plurality of cell sensing circuits 232. In view of the substantial similarity in structure and function of the components associated with the cell management module 230 with respect to the cell management module 230', like reference numerals are used hereinafter and in the drawings to identify like components while reference numerals including a prime (') symbol are used to identify modified components.

In the example of the cell management module 230' of FIG. 12, the secondary circuits 236a'-236n' of each cell sensing circuit 232a'-232n' is modified to remove the diodes 254a-254n and add a secondary switch 256a-256n. Here, the secondary switches 256a-256n are configured to act as direction-controllable diodes. Particularly, timing of the pulses of the primary switches 252a-252n and the secondary switches 256a-256n can be adjusted such that the signals $I_P$, $I_S$ flow in a first direction $I_{P+}$, $I_{S+}$ to charge the power cells 210 and flow in an opposite second direction $I_{P-}$, $I_{S-}$ to discharge the power cells 210.

As shown, the secondary switches 256a-256n are disposed between the power cell 210a-210n and are controlled by the corresponding control circuit 250a-250n of the cell sensing circuit 232a'-232n'. Including the secondary switches 256a-256n in the secondary circuits 236a'-236n' forms a bi-directional flyback converter connected to the low-voltage (12 to 48V) power supply reservoir 246. In a first, forward (i.e., charging) mode, energy is transferred from primary voltage source 246 by first pulsing the primary switch 252a-252n so that the primary signal $I_{P+}$ flows to the transformer 238a-238n and energy is stored into the transformer 238a-238n. Upon release of the primary switch 252a-252b (i.e., pulsing stopped), the secondary switch 256a-256n is closed to allow the secondary signal $I_{S+}$ to flow in the secondary circuit 232a'-232n' so that energy is transferred to the power cell 210a-210n. In a second reverse (i.e., discharging) mode, energy is transferred from the power cell primary voltage source 246. Here, the secondary switch 256a-256n is pulsed first so that the secondary signal $I_{S-}$ flows from the power cell 210 to the transformer 238a-238n to charge the transformer 238a-238n with voltage from the power cell 210. With the transformer 238a-238n charged, the primary switch 252a-252n is closed and the primary signal $I_{P-}$ flows from the transformer 238a-238n to the primary voltage source 246 to transfer the energy from the transformer 238a-238n back to the primary voltage source 246. In the cell sensing circuits 232a'-232n' of FIG. 12, the respective secondary switches 256a-256n are controlled from the primary side (i.e., the side including the primary circuit 234a-234n) using isolation means, such as a capacitor.

The cell management module 230' of FIG. 12 provides several advantages compared to conventional systems. For instance, vehicle power systems typically include a low-voltage net DC/DC converter module configured to convert high-voltage power received from a high-voltage power system to a low voltage (12V to 48V) capable of being utilized by vehicle components not associated with the vehicle motors 16 (i.e., power steering, brake boosters, accessories, etc.). Accordingly, low-voltage DC power is provided directly from the power supply modules (200) without the need for the DC/DC converter, thereby minimizing system costs and complexities. Additionally, the configuration of FIG. 12 allows energy to be transferred directly from power cells (210) identified as having a relatively high charge to the primary power source (246) (e.g., a low voltage bus) so that the energy can then be transferred to power cells 210 within the power supply module 200 having a relatively low voltage. Thus, the system of FIG. 12 allows for improved power cell 210 balancing by allowing bi-directional power transfer, as opposed to conventional systems that require low-voltage cells 210 to be charged by an external power source to match a higher voltage of another one of the power cells 210 within the power supply module 200.

As discussed throughout, cell management modules 230 configured according to the principles of the present disclosure provide several advantages compared to known configurations and methods for measuring SOC and SOH of a power cell. For instance, conventional cell measurement technologies utilize specialty ASIC (application-specific integrated circuit) components that manage cell voltage measurement and cell balancing using resistors to bleed off cell energy as thermal energy. However, the use of resistors results in a reduction in efficiency and increased heat within the power supply module, as useful electrical energy is converted and discarded as wasted thermal energy. In contrast, the configuration of the present disclosure infers the voltage of the power cells 210 by measuring the current of the primary signal $I_P$ and balances power cell voltage 210 by modifying the pulse frequency and/or duration of the primary signal $I_P$ through switching. Thus, energy loss and heat generation are minimized.

Another advantage of the cell management module 230 includes allowing any number of power cells 210 to be incorporated in series without incrementally increasing the costs or complexity associated with managing the power cells 210. As discussed previously, conventional cell measurement technologies utilize ASIC components. However, ASIC components are typically limited in the number of power cells that can be managed (e.g., one ASIC can manage 6-18 power cells). Thus, as the number of power cells in a conventional power supply module increases, additional ASIC components must be added to the cell management architecture, which incrementally increases the costs and complexity of the design. In contrast, the current cell management module 230 utilizes a single current measurement circuit 248 to measure and balance any number of power cells 210 by pulsing the primary signal $I_P$ to a targeted power cell 210.

The foregoing description has been provided for purposes of illustration and description. It is not intended to be exhaustive or to limit the disclosure. Individual elements or features of a particular configuration are generally not limited to that particular configuration, but, where applicable, are interchangeable and can be used in a selected configuration, even if not specifically shown or described. The same may also be varied in many ways. Such variations are not to be regarded as a departure from the disclosure, and all such modifications are intended to be included within the scope of the disclosure.

What is claimed is:

1. A cell management module for a power supply module including a plurality of power cells, the cell management module comprising:
   at least one cell-sensing circuit including:
   a first sub-circuit including a first transformer winding, the first sub-circuit operable to selectively pulse a first signal having a first voltage through the first transformer winding; and
   a second sub-circuit separate and distinct from the first sub-circuit and including a second transformer winding inductively coupled to the first transformer winding and one of the plurality of power cells having a second voltage, the second sub-circuit including a second signal having a second voltage in the second transformer winding and a Schottky diode disposed between the second transformer winding and the one of the plurality of power cells; and a current measurement circuit connected to the first sub-circuit and configured to infer the second voltage of the one of the power cells based on a measured current of the first signal received from the first transformer winding;

wherein when a voltage of the second signal is greater than the sum of a voltage drop associated with the Schottky diode and a voltage of the one of the plurality of power cells, the difference in the voltage results in a modified second signal flowing from the one of the plurality of power cells to the second transformer winding, the modified second signal having at least one of a change in voltage or current compared to the second signal.

2. The cell management module of claim 1, wherein the first sub-circuit includes a first switch operable to pulse the first signal through the first transformer winding.

3. The cell management module of claim 2, wherein the first sub-circuit includes a control circuit operable to selectively open and close the first switch.

4. The cell management module of claim 3, wherein the second sub-circuit includes a second switch operable to pulse a second signal having the second voltage through the second transformer winding.

5. The cell management module of claim 1, wherein the second sub-circuit includes a rectifier disposed between the second transformer winding and the one of the power cells.

6. The cell management module of claim 1, wherein the at least one cell-sensing circuit includes a plurality of cell-sensing circuits, each of the plurality of cell-sensing circuits connected to the current measurement circuit in parallel.

7. The cell management module of claim 6, further comprising a power source providing the first signal, each of the plurality of the cell-sensing circuits connected to the power source in parallel.

8. The cell management module of claim 6, wherein the plurality of cell-sensing circuits includes more than eighteen (18) cell-sensing circuits.

9. The cell management module of claim 6, further comprising a plurality of circuit controllers connected to each of the plurality of the cell-sensing circuits and configured to selectively permit the first signal through a single one of the cell-sensing circuits while preventing the first signal from flowing through another of the cell-sensing circuits.

* * * * *